(12) United States Patent
Nelson et al.

(10) Patent No.: US 12,525,444 B2
(45) Date of Patent: Jan. 13, 2026

(54) AUTOMATED OVERLAY REMOVAL DURING WAFER SINGULATION

(71) Applicant: TEXAS INSTRUMENTS INCORPORATED, Dallas, TX (US)

(72) Inventors: Andrew Nelson, Van Alstyne, TX (US); John C. Ehmke, Longview, TX (US); Daryl R. Koehl, Garland, TX (US); Nathan Bays, Rowlett, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 363 days.

(21) Appl. No.: 17/877,582

(22) Filed: Jul. 29, 2022

(65) Prior Publication Data

US 2023/0238234 A1    Jul. 27, 2023

Related U.S. Application Data

(60) Provisional application No. 63/302,295, filed on Jan. 24, 2022.

(51) Int. Cl.
*H01L 21/02* (2006.01)
*H10D 84/01* (2025.01)

(52) U.S. Cl.
CPC .. *H01L 21/02087* (2013.01); *H01L 21/02008* (2013.01); *H10D 84/01* (2025.01)

(58) Field of Classification Search
CPC ......... H01L 21/02087; H01L 21/02008; H01L 21/82; H01L 21/67092; G01R 31/2886
See application file for complete search history.

(56) References Cited

U.S. PATENT DOCUMENTS

| | | | |
|---|---|---|---|
| 8,955,216 B2* | 2/2015 | Rathburn | H01L 21/6835 29/841 |
| 11,293,975 B2* | 4/2022 | Lou | G01R 31/2887 |
| 2006/0097742 A1* | 5/2006 | McGinnis | G01R 31/2886 324/750.19 |
| 2010/0065963 A1* | 3/2010 | Eldridge | H01L 24/85 257/734 |
| 2020/0386787 A1* | 12/2020 | Contractor | G01R 31/2601 |

FOREIGN PATENT DOCUMENTS

| | | | | |
|---|---|---|---|---|
| EP | 0792462 B1 | * | 8/2004 | ........ H01L 23/49811 |
| JP | 2005311043 A | * | 11/2005 | ............. H01L 24/03 |
| KR | 20030085142 A | * | 11/2003 | ............. H01L 22/00 |

* cited by examiner

*Primary Examiner* — Mohammed Shamsuzzaman
(74) *Attorney, Agent, or Firm* — Michael T. Gabrik; Frank D. Cimino

(57) ABSTRACT

In some examples, a device comprises a wafer chuck, a member having a surface facing the wafer chuck, a blade supported by the surface, a first vacuum nozzle extending through the member and having a first vacuum orifice facing a same direction as the surface, and a second vacuum nozzle extending through the member and having a second vacuum orifice facing the same direction as the surface. The first and second vacuum orifices are on opposing sides of the blade.

20 Claims, 45 Drawing Sheets

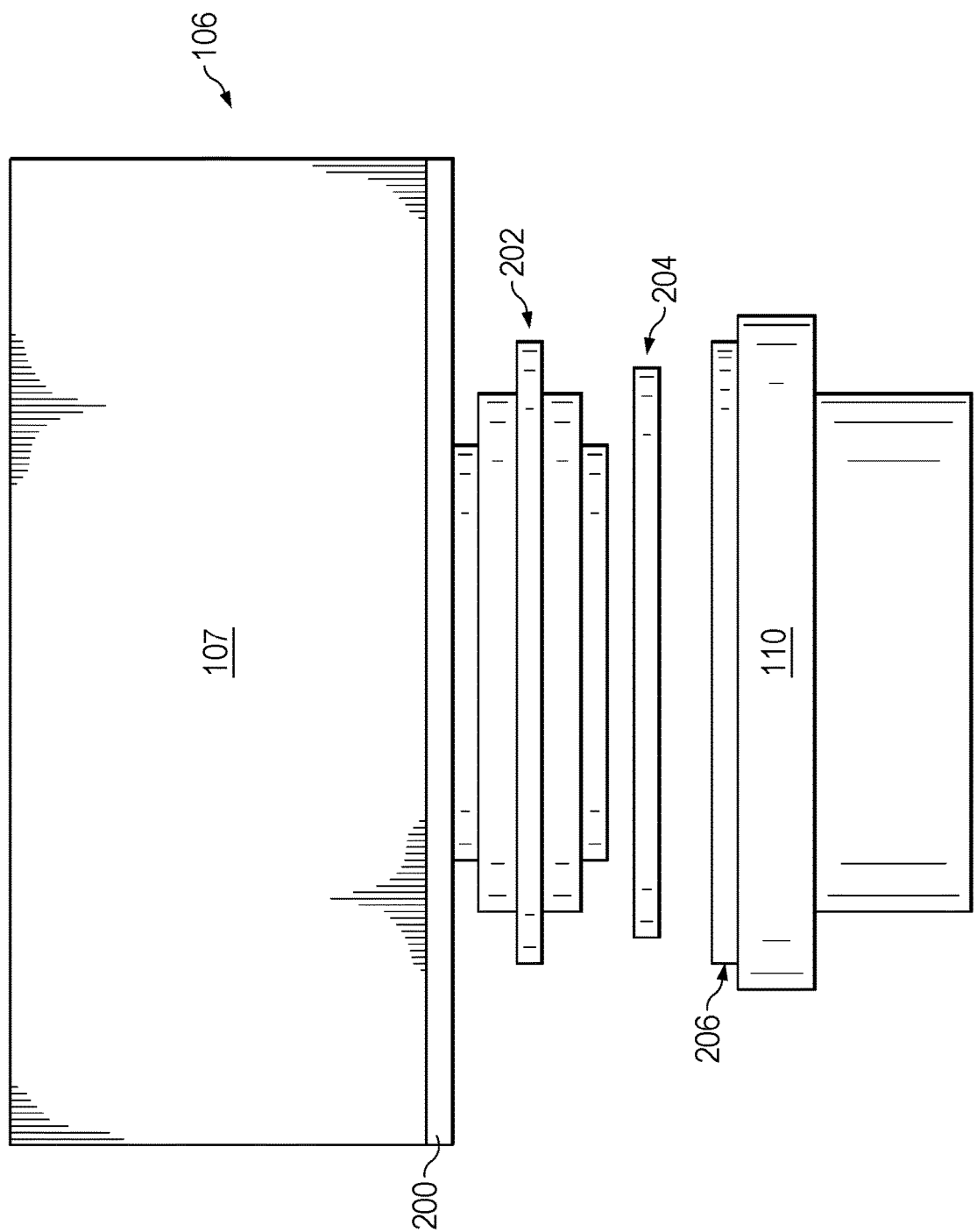

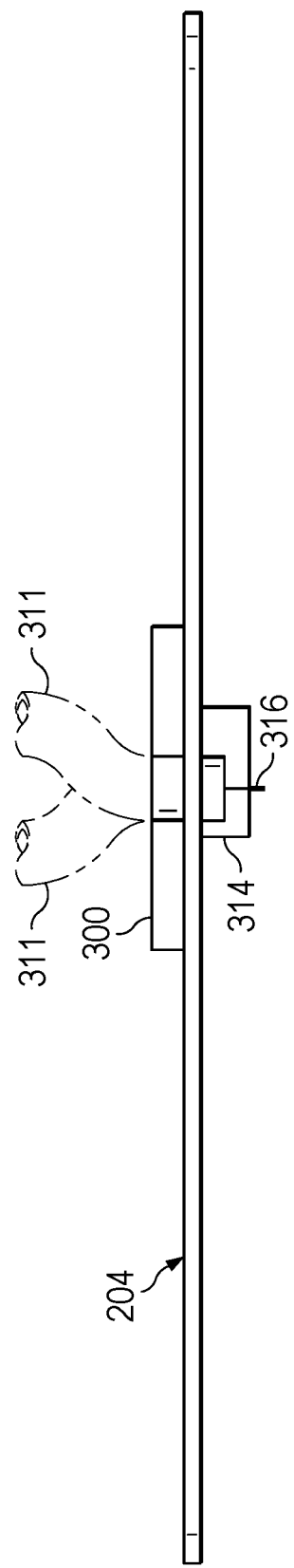

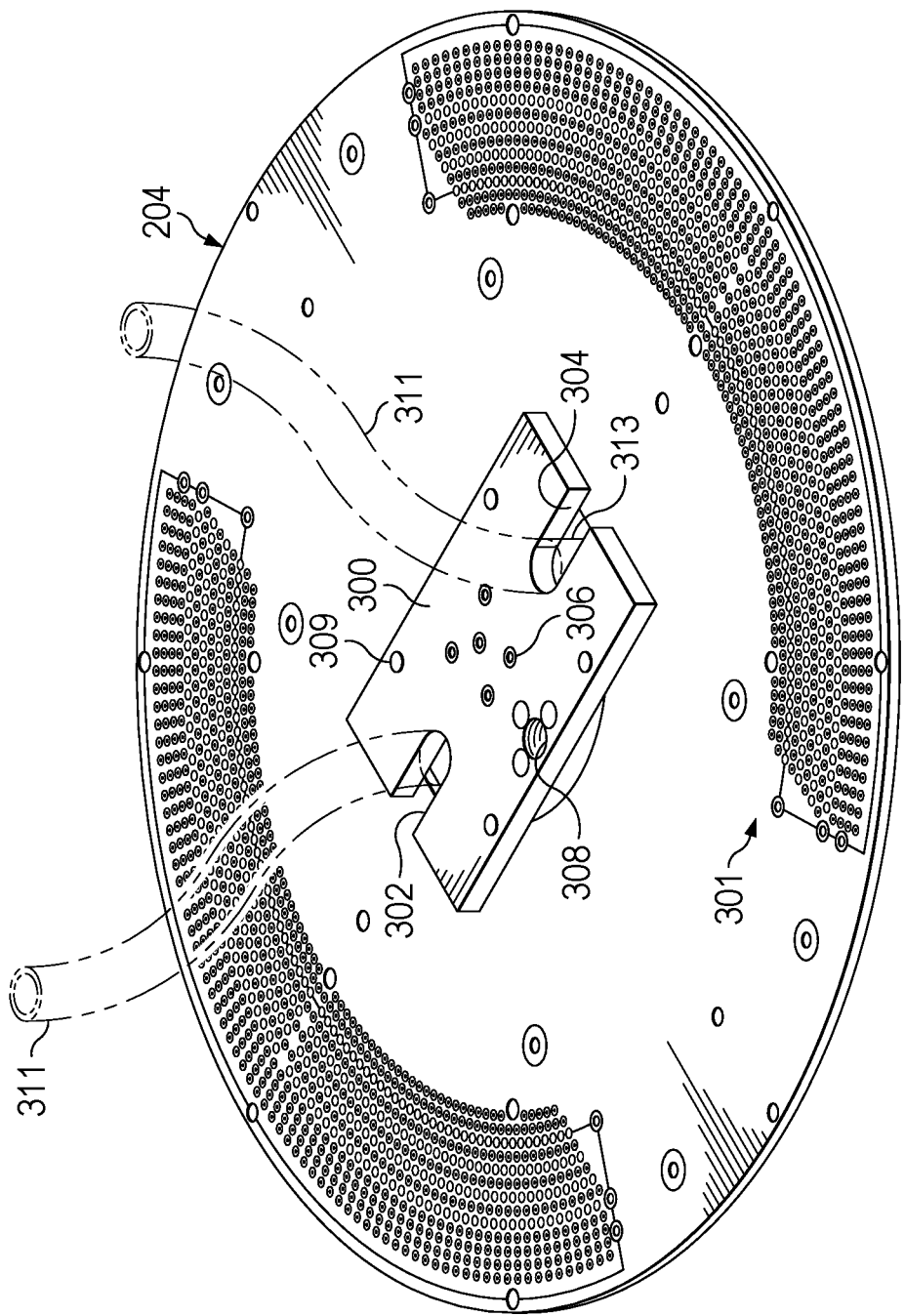
FIG. 3D1

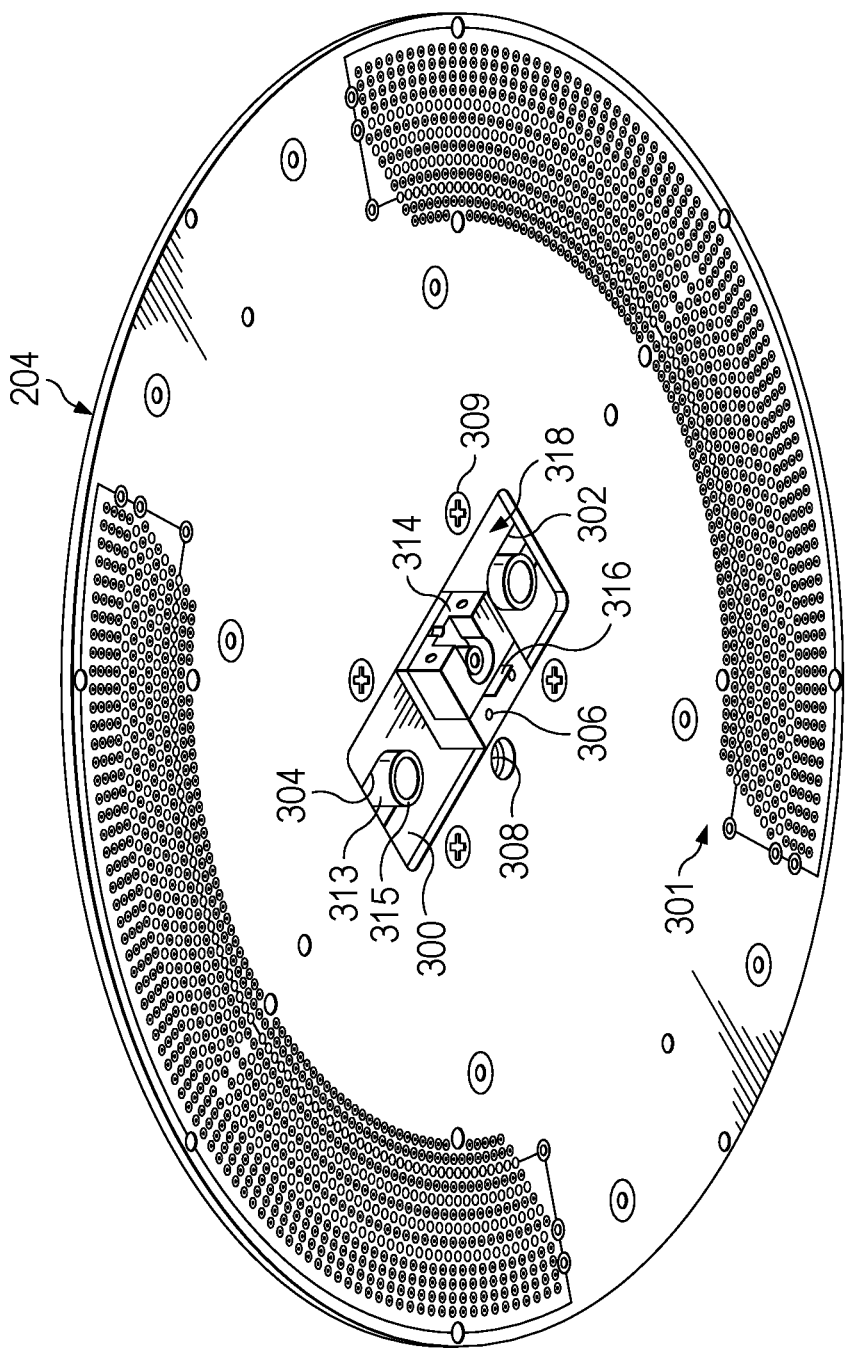
FIG. 3D2

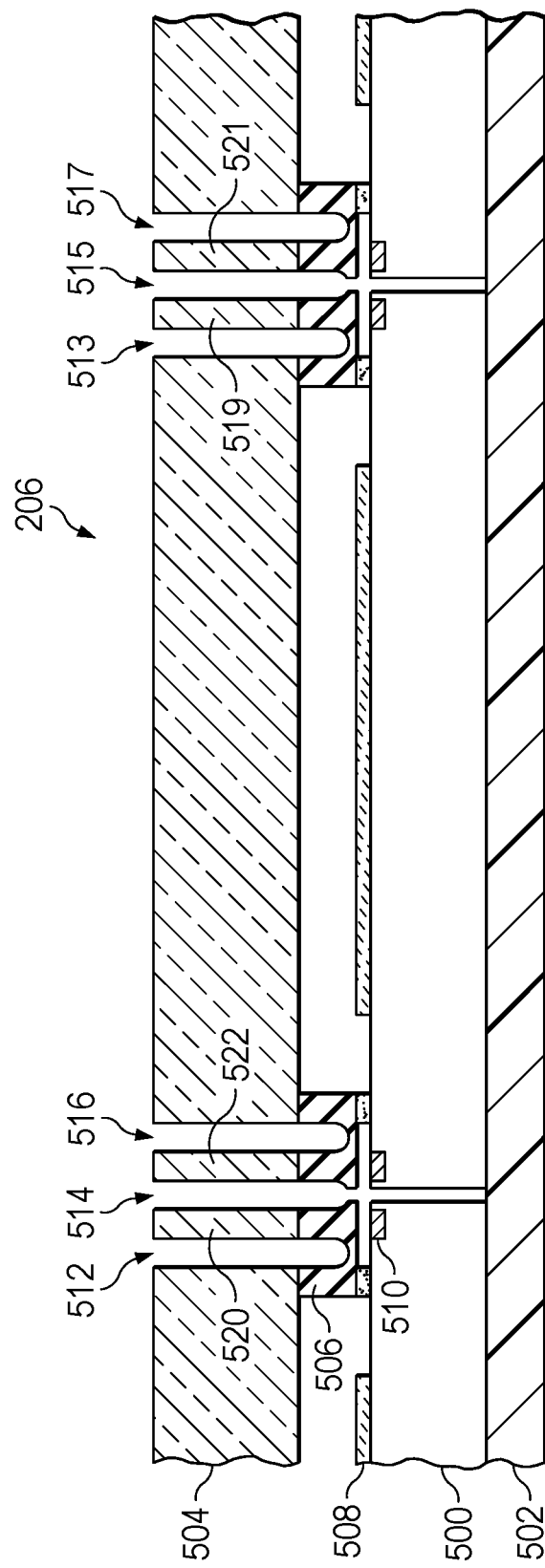
FIG. 5A1

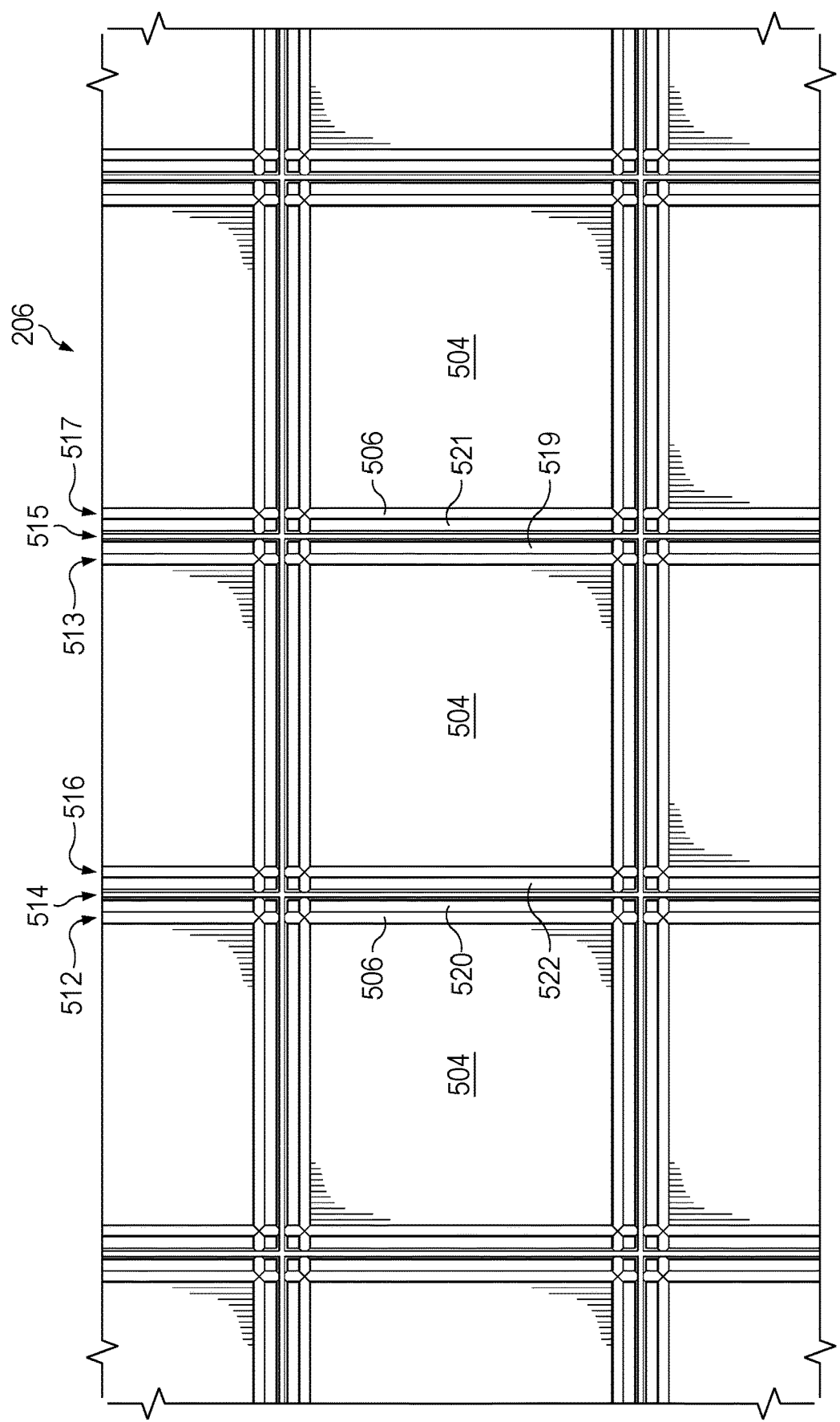
FIG. 5A2

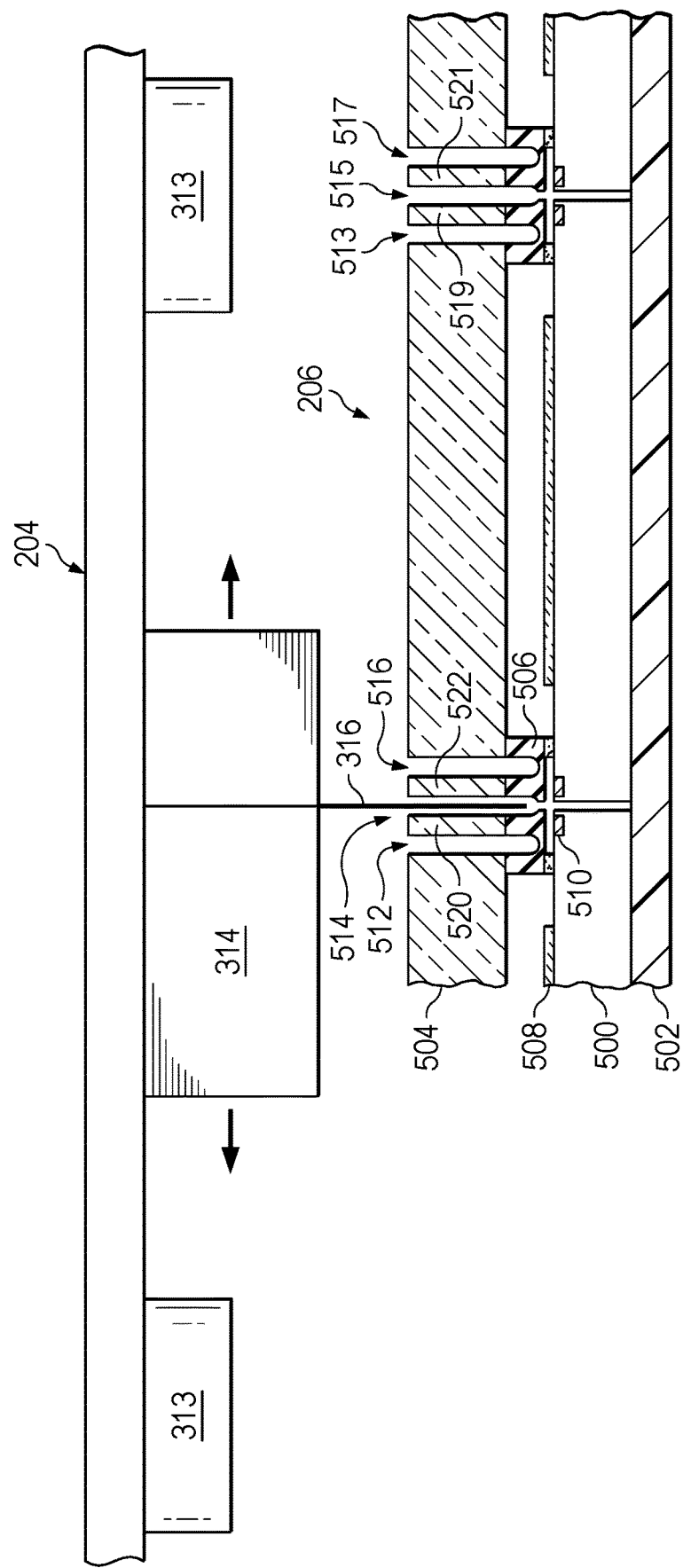
FIG. 5B1

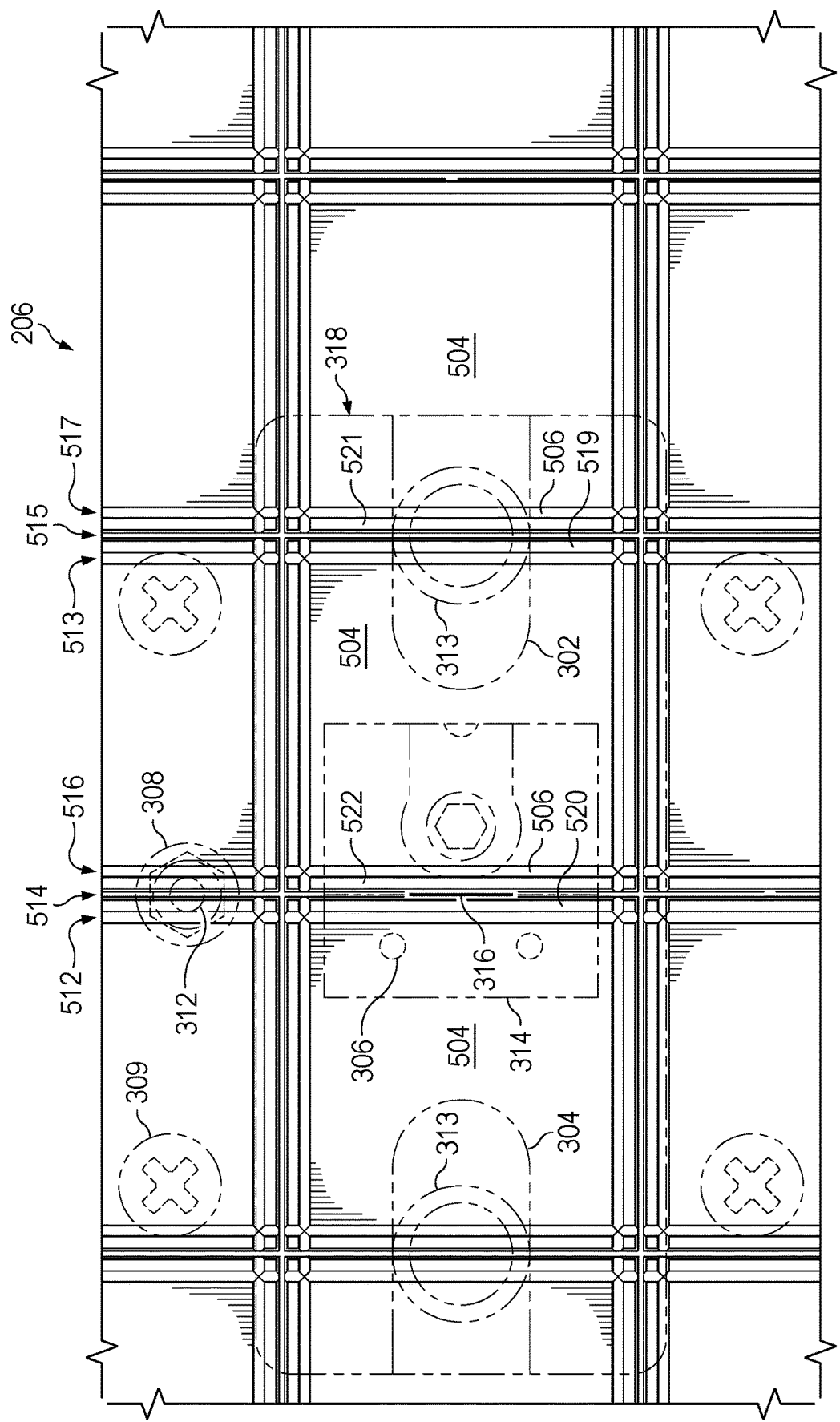
FIG. 5B2

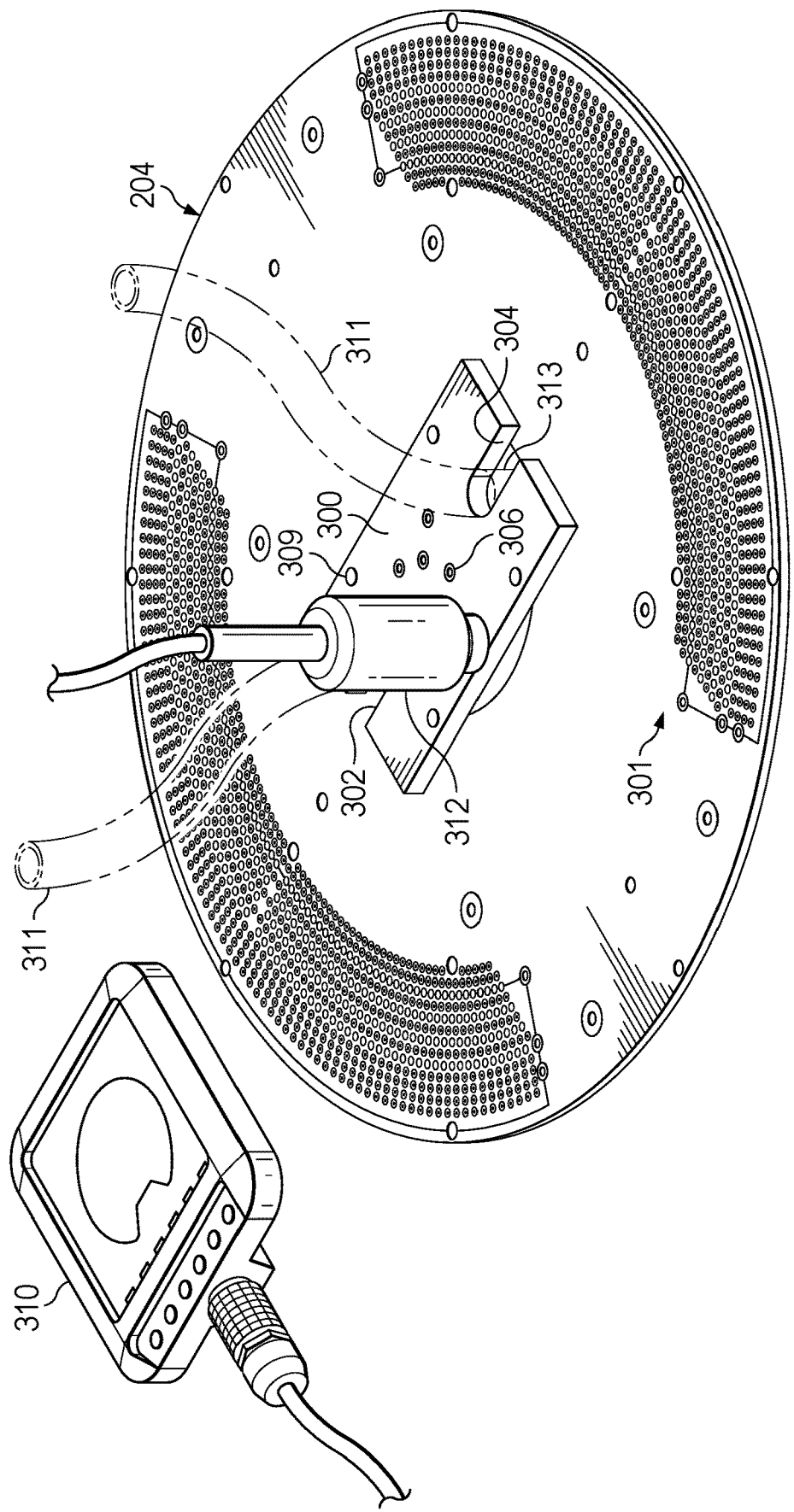
FIG. 5B3

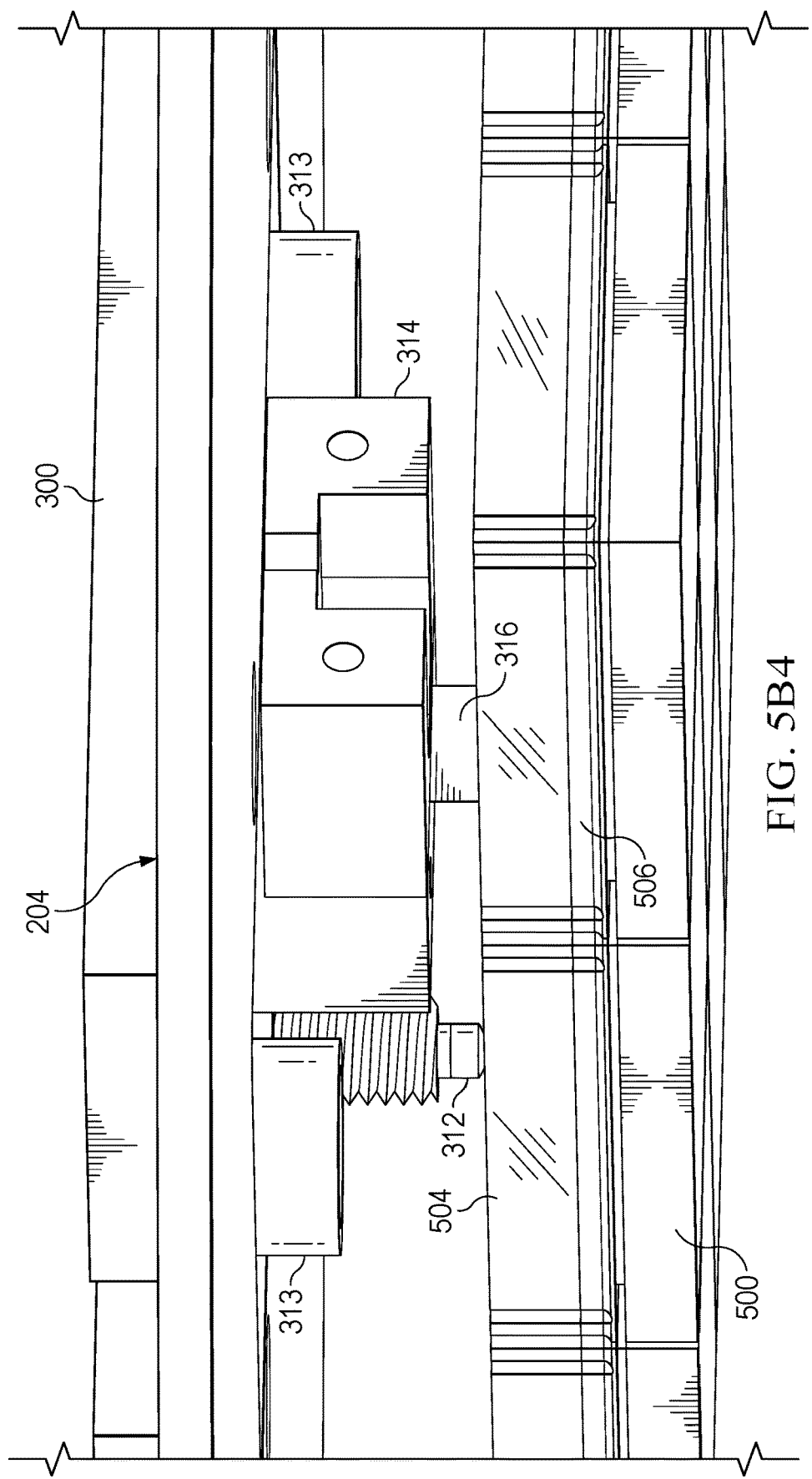
FIG. 5B4

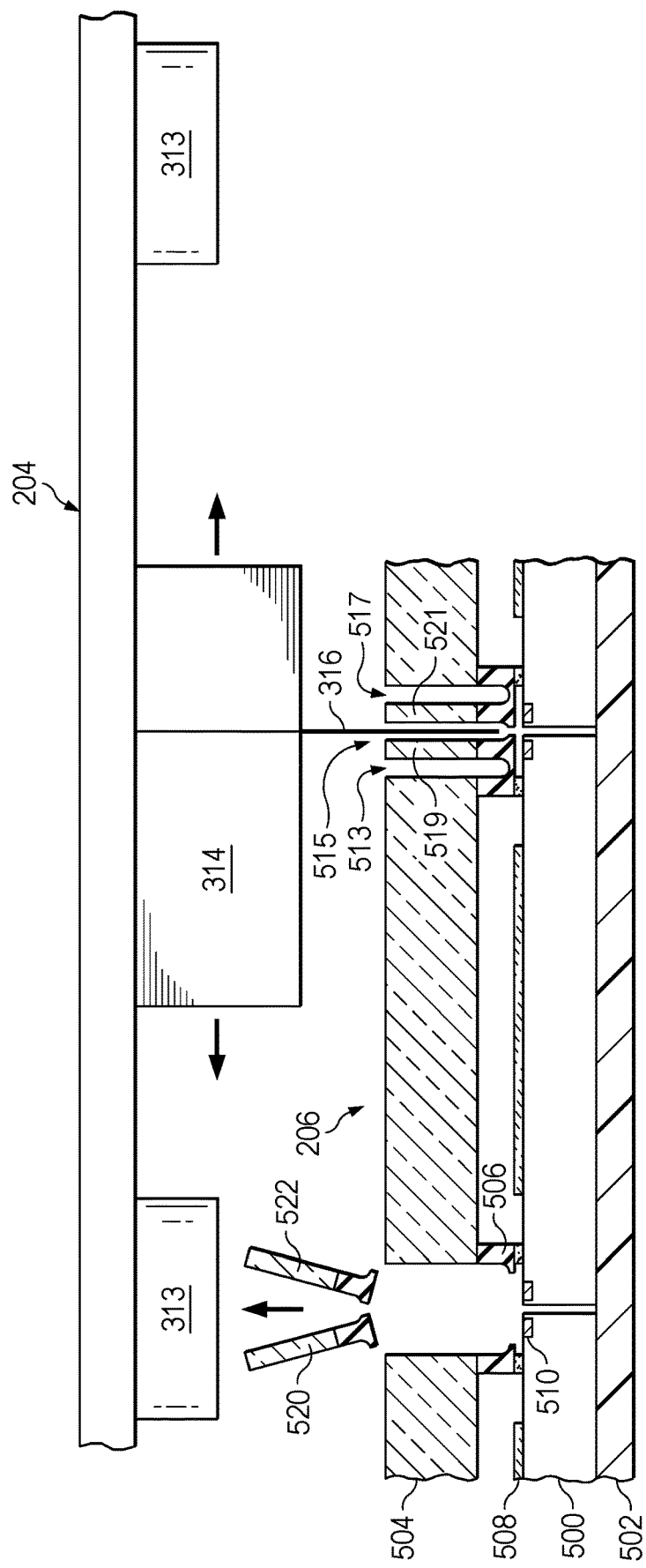
FIG. 5C1

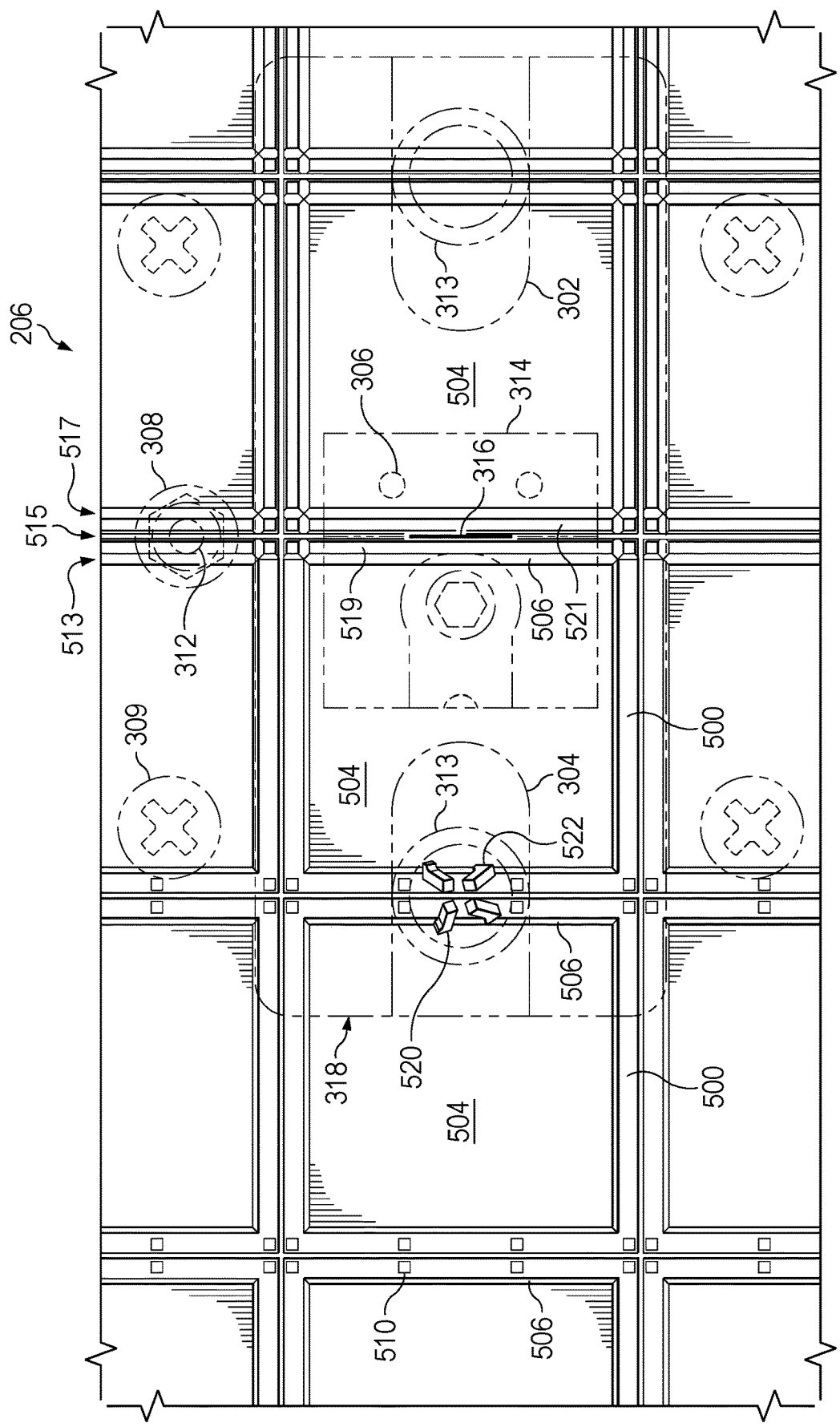
FIG. 5C2

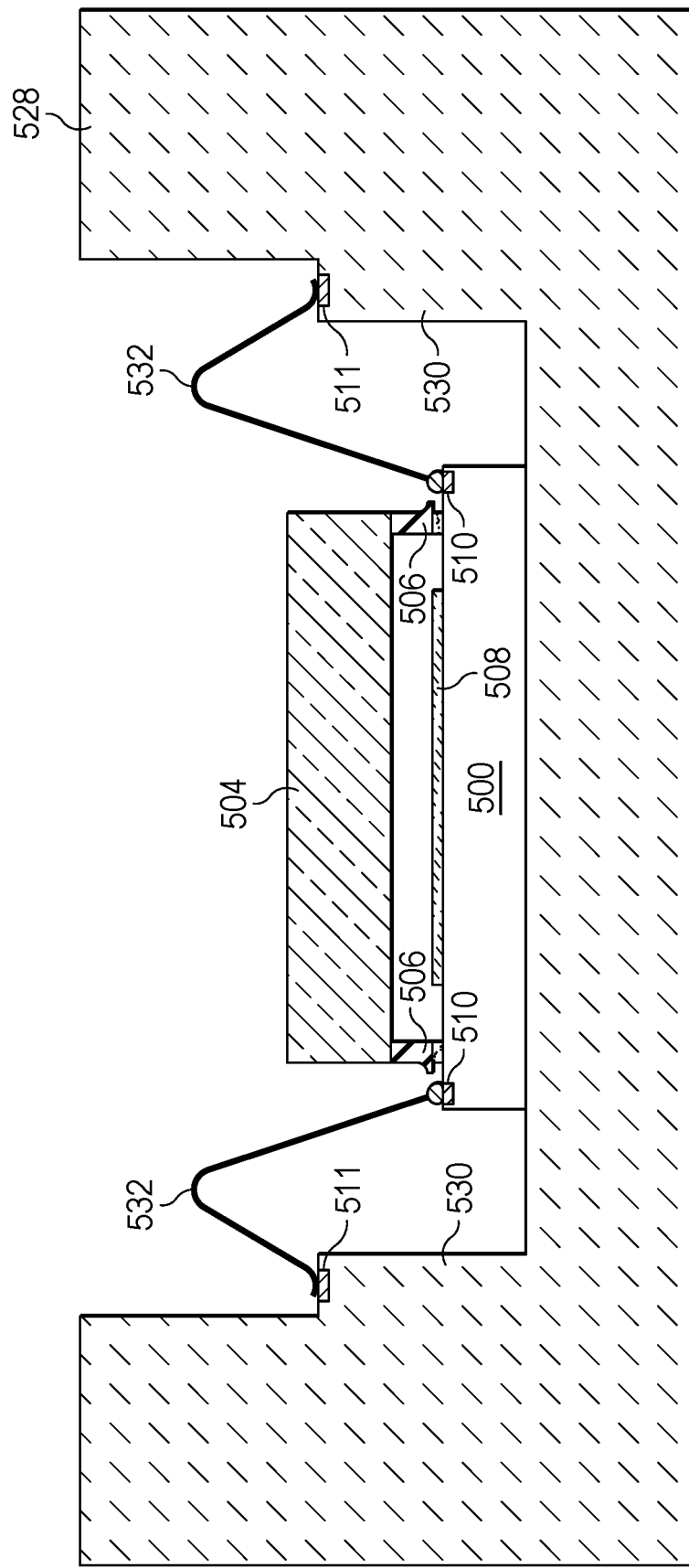
FIG. 5D1

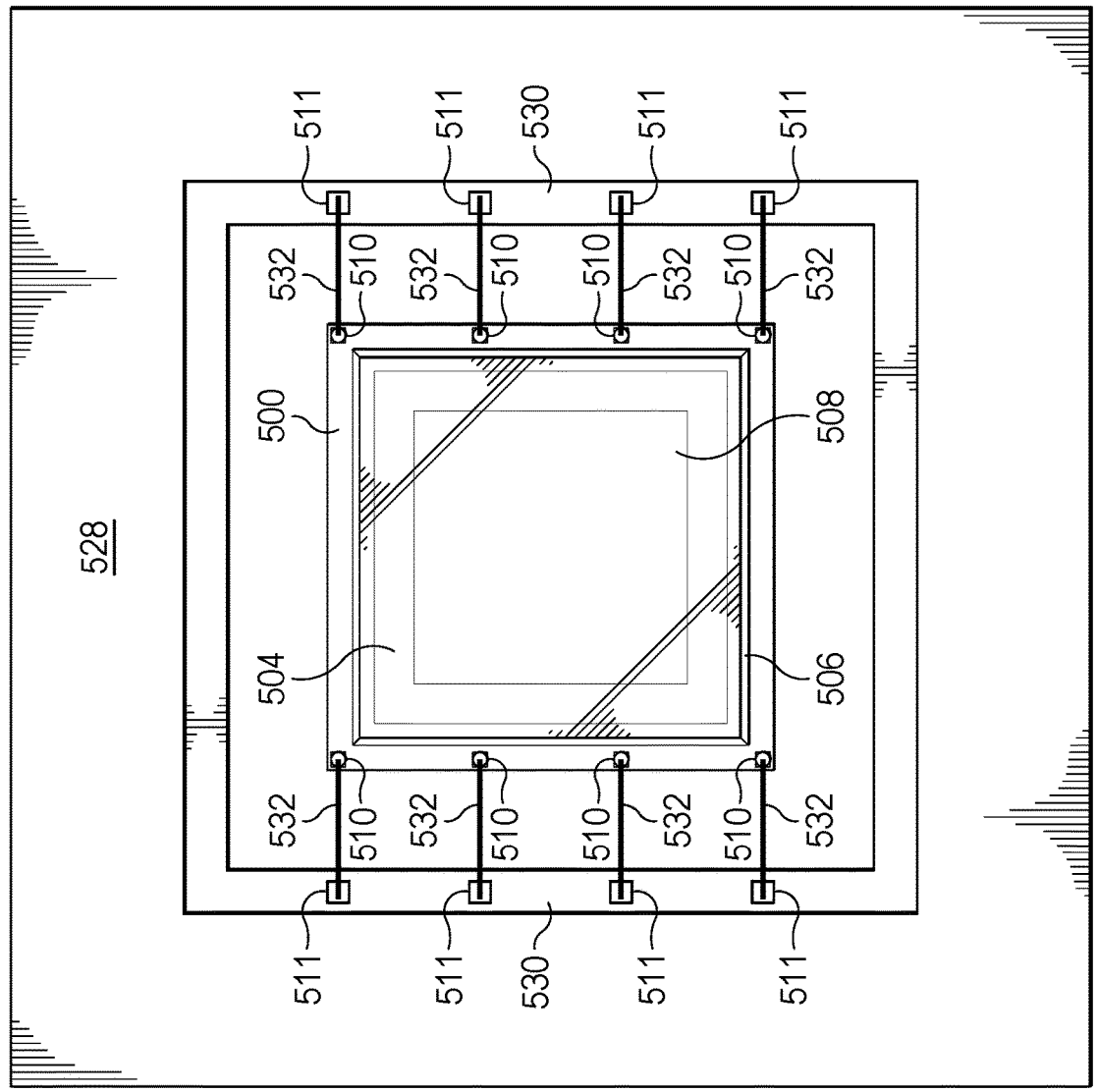
FIG. 5D2

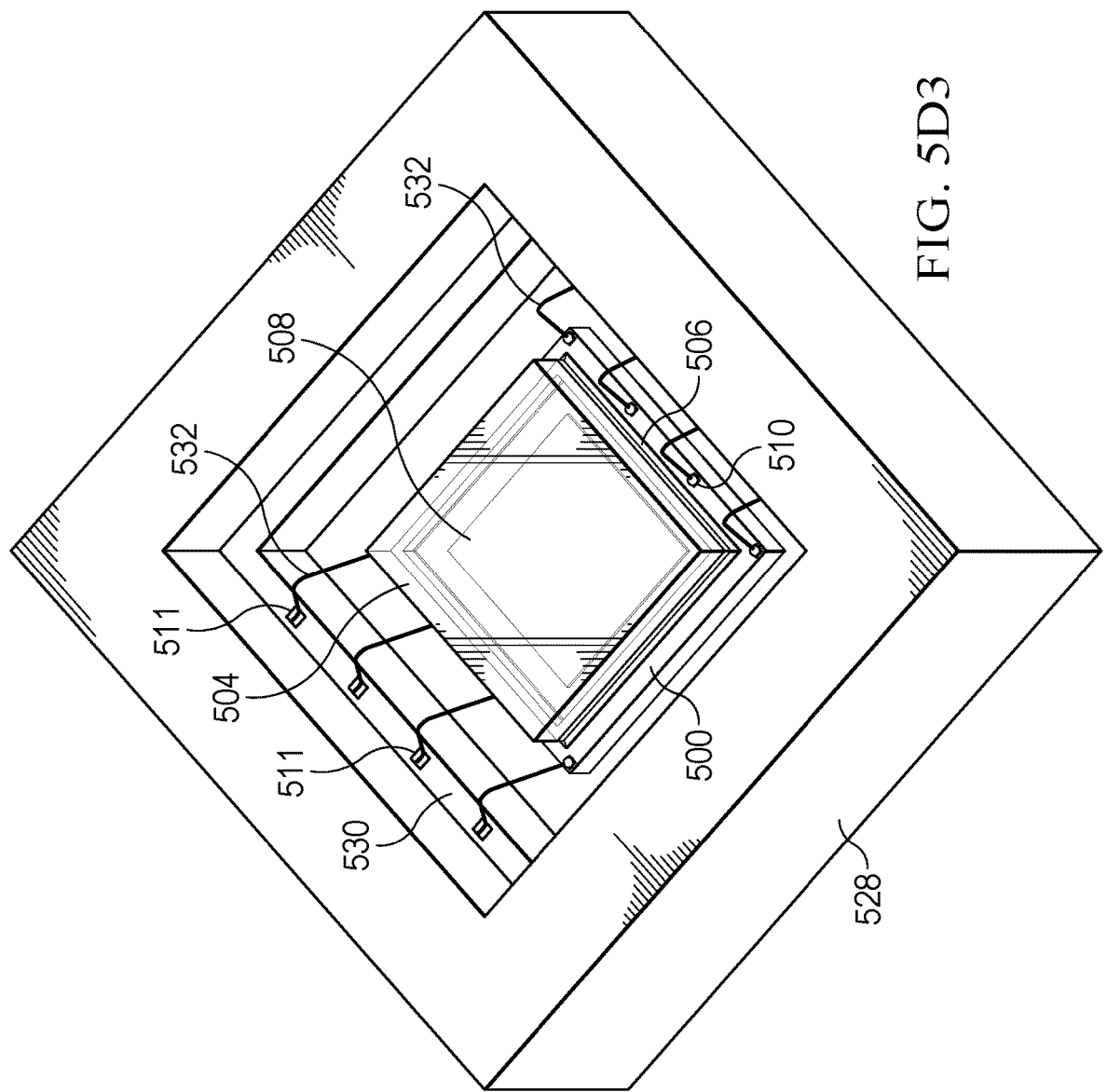
FIG. 5D3

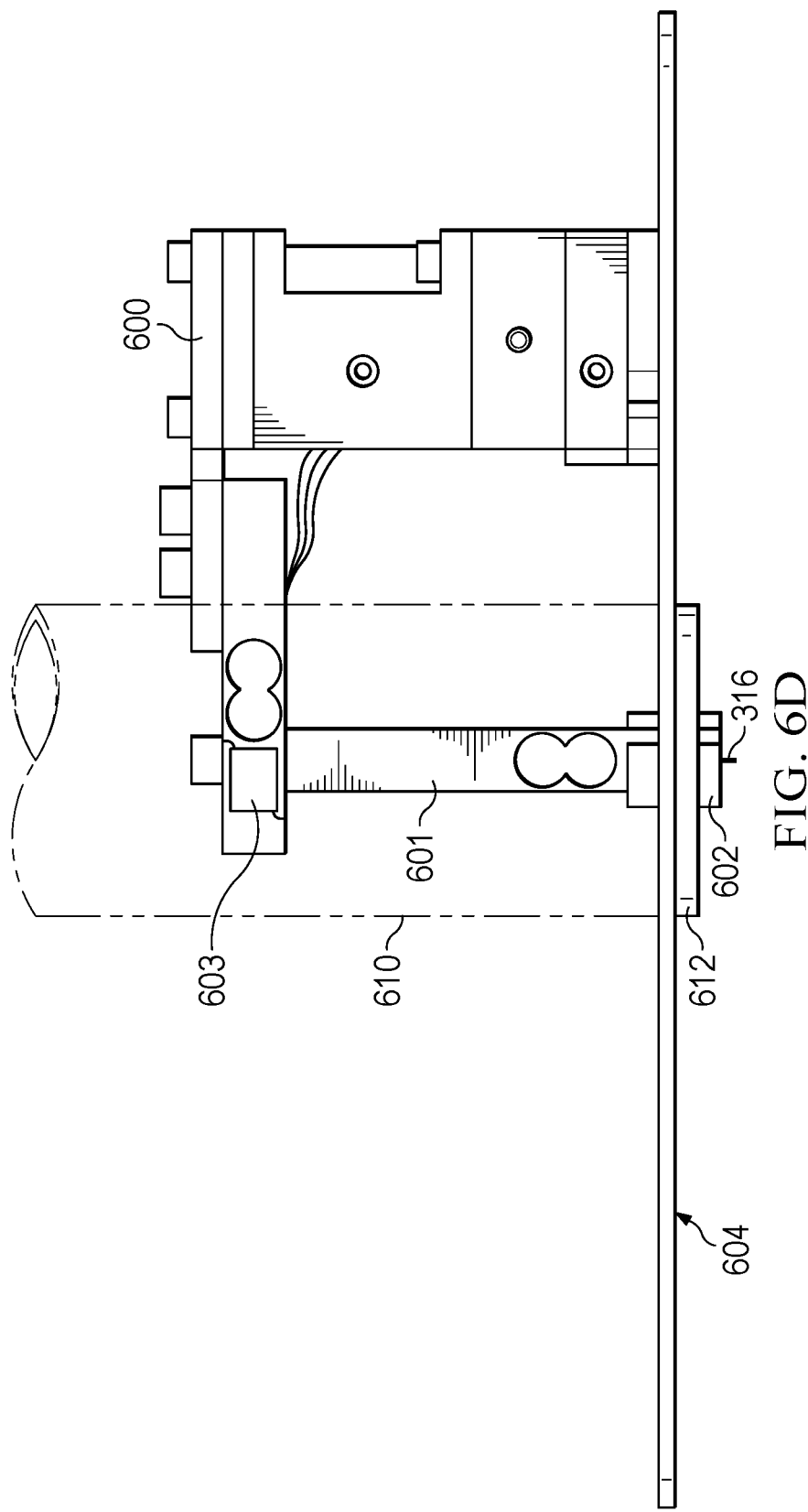

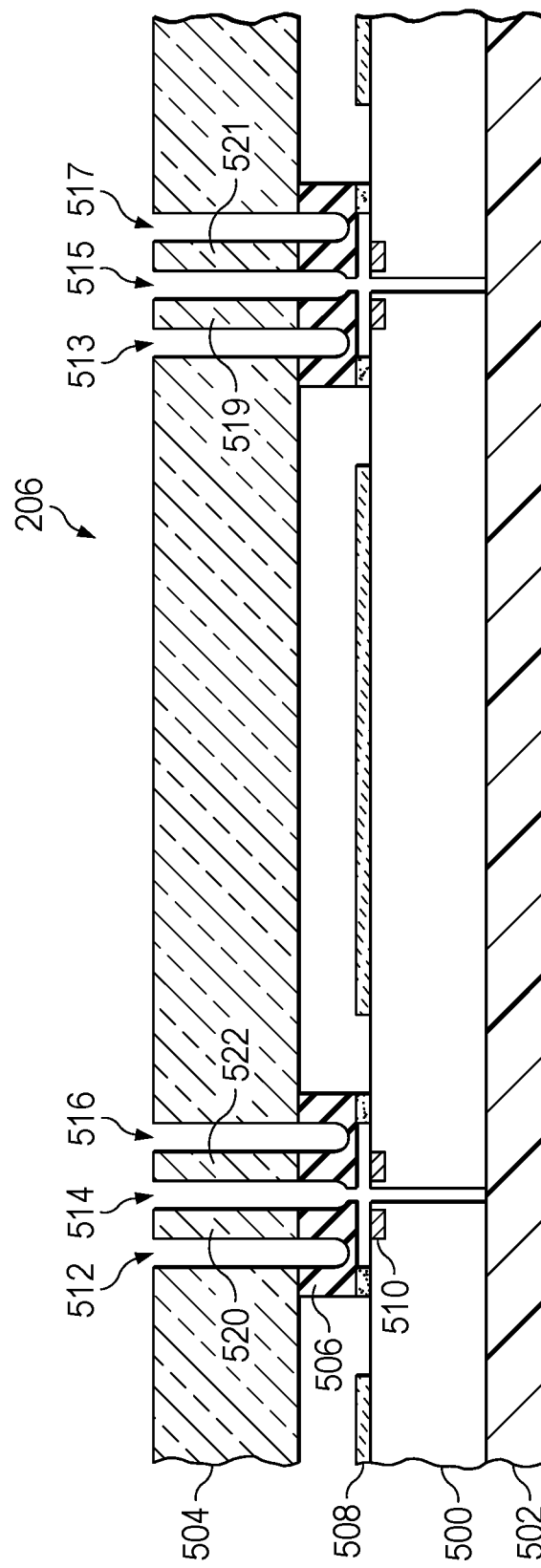
FIG. 8A1

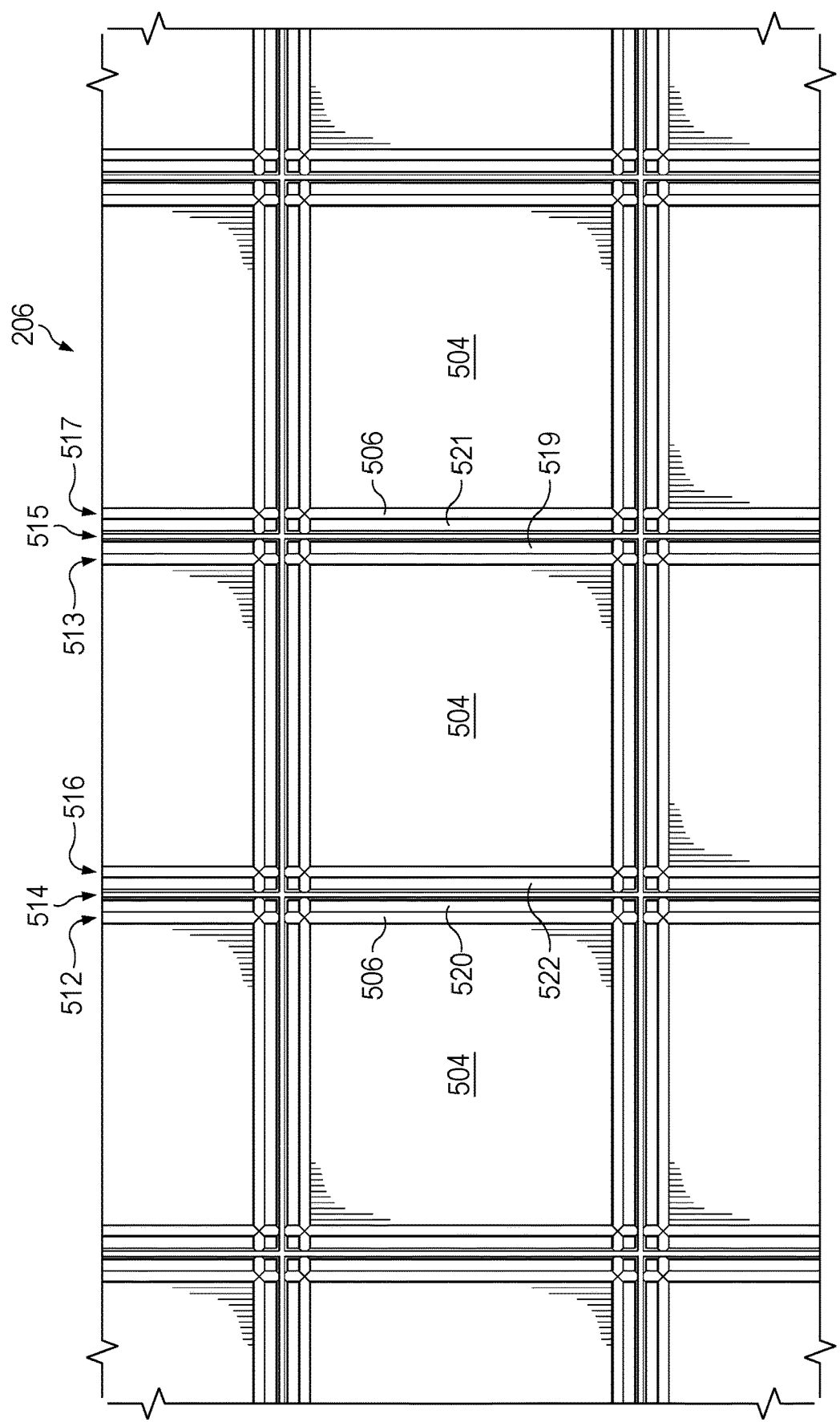
FIG. 8A2

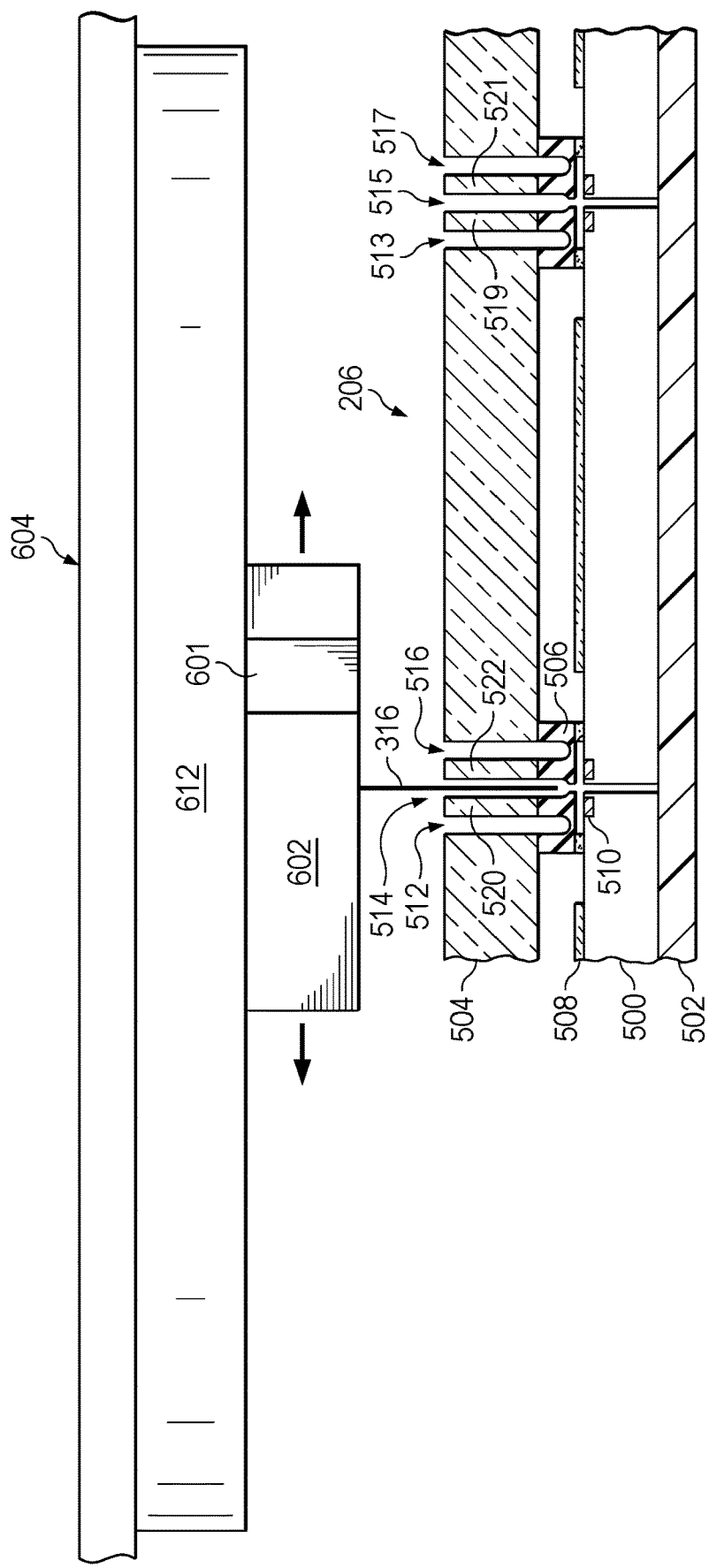
FIG. 8B1

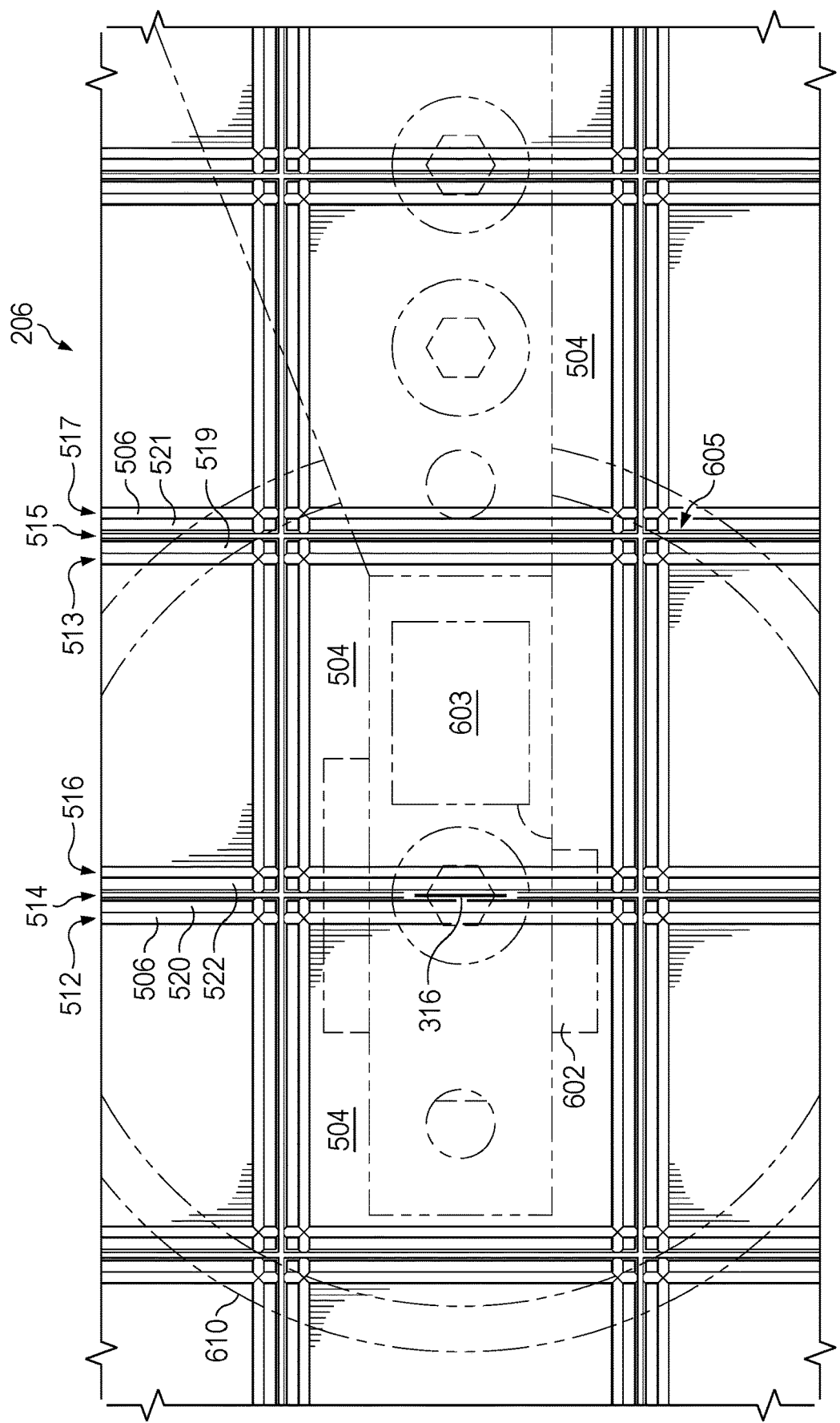
FIG. 8B2

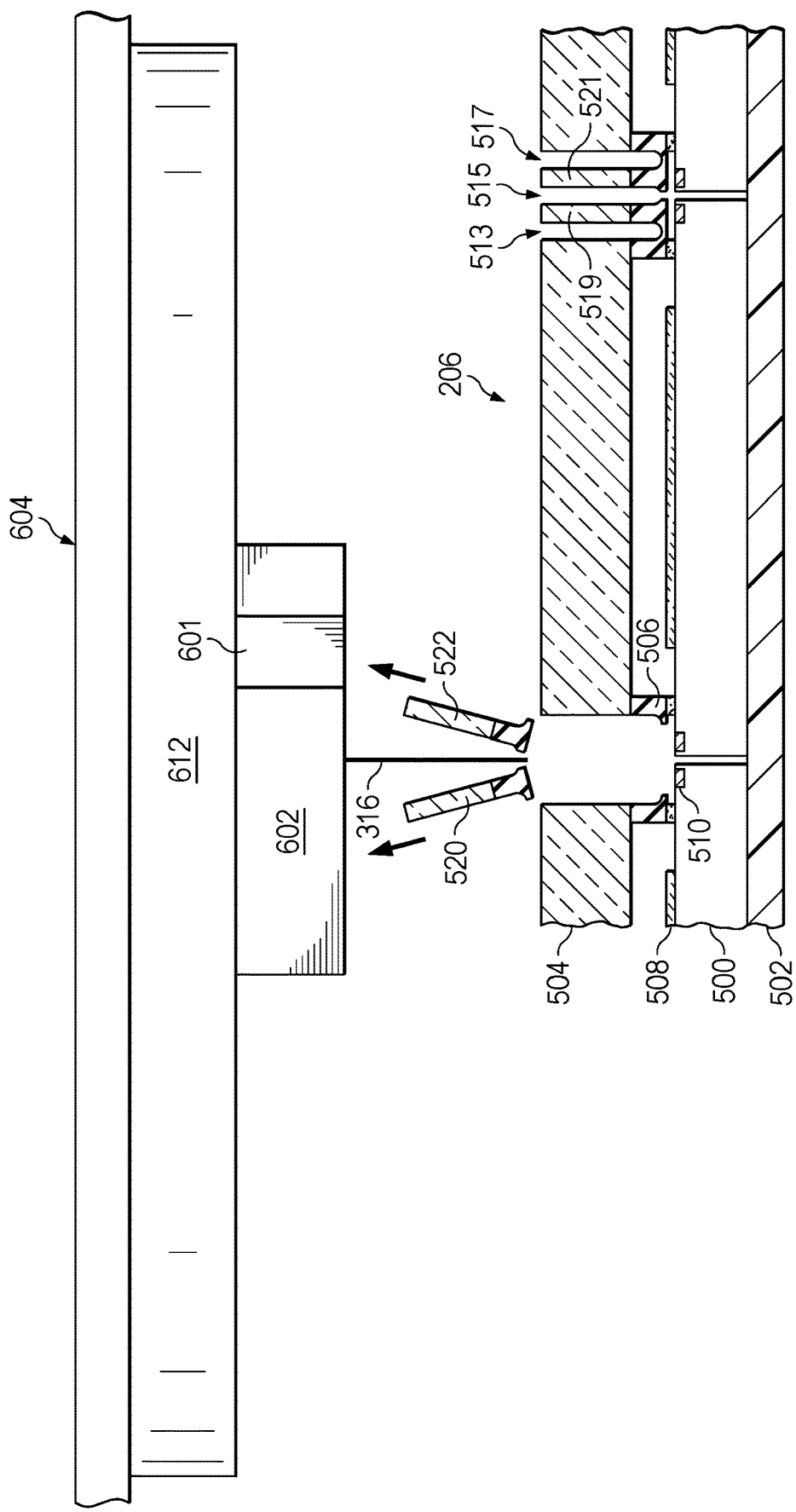
FIG. 8C1

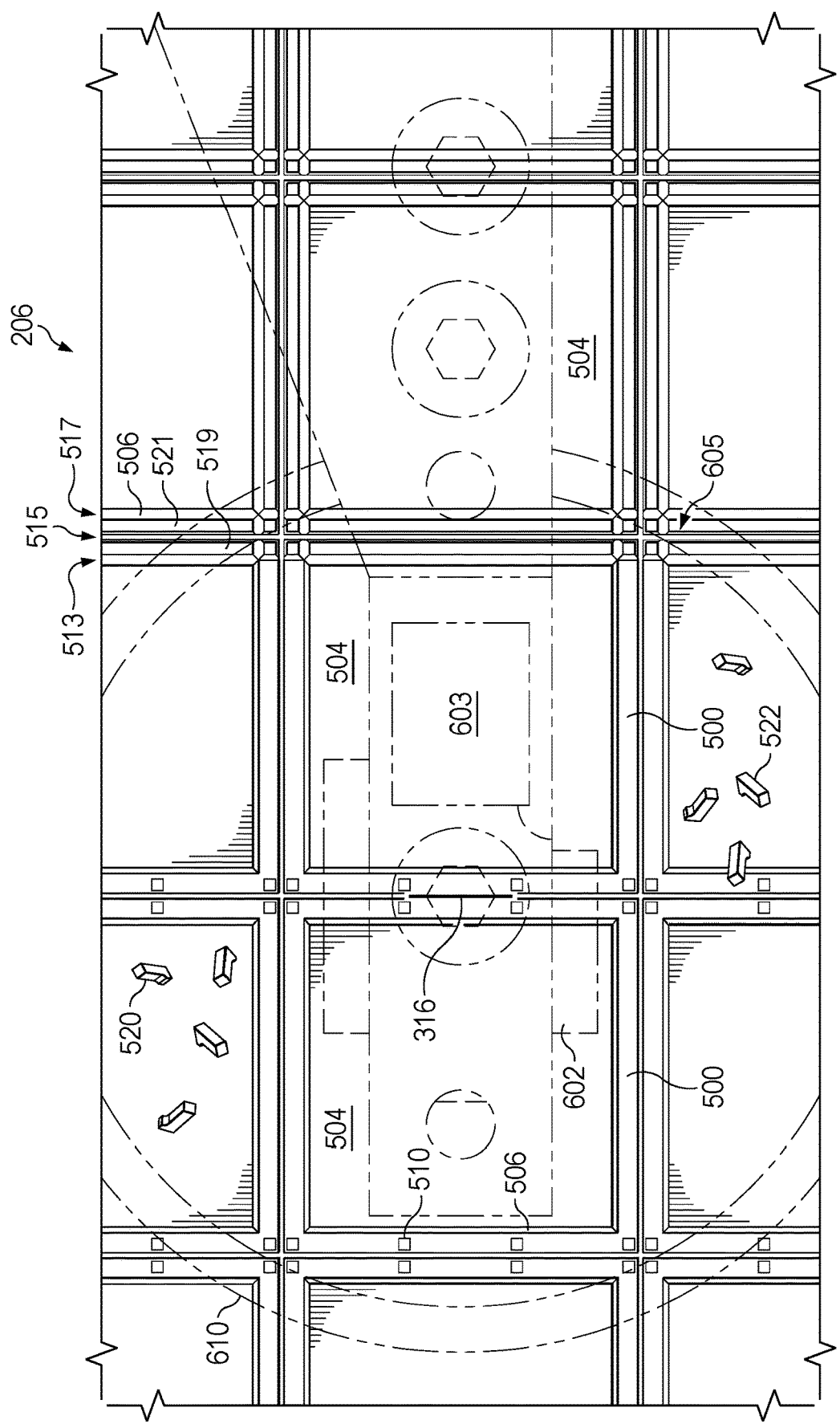
FIG. 8C2

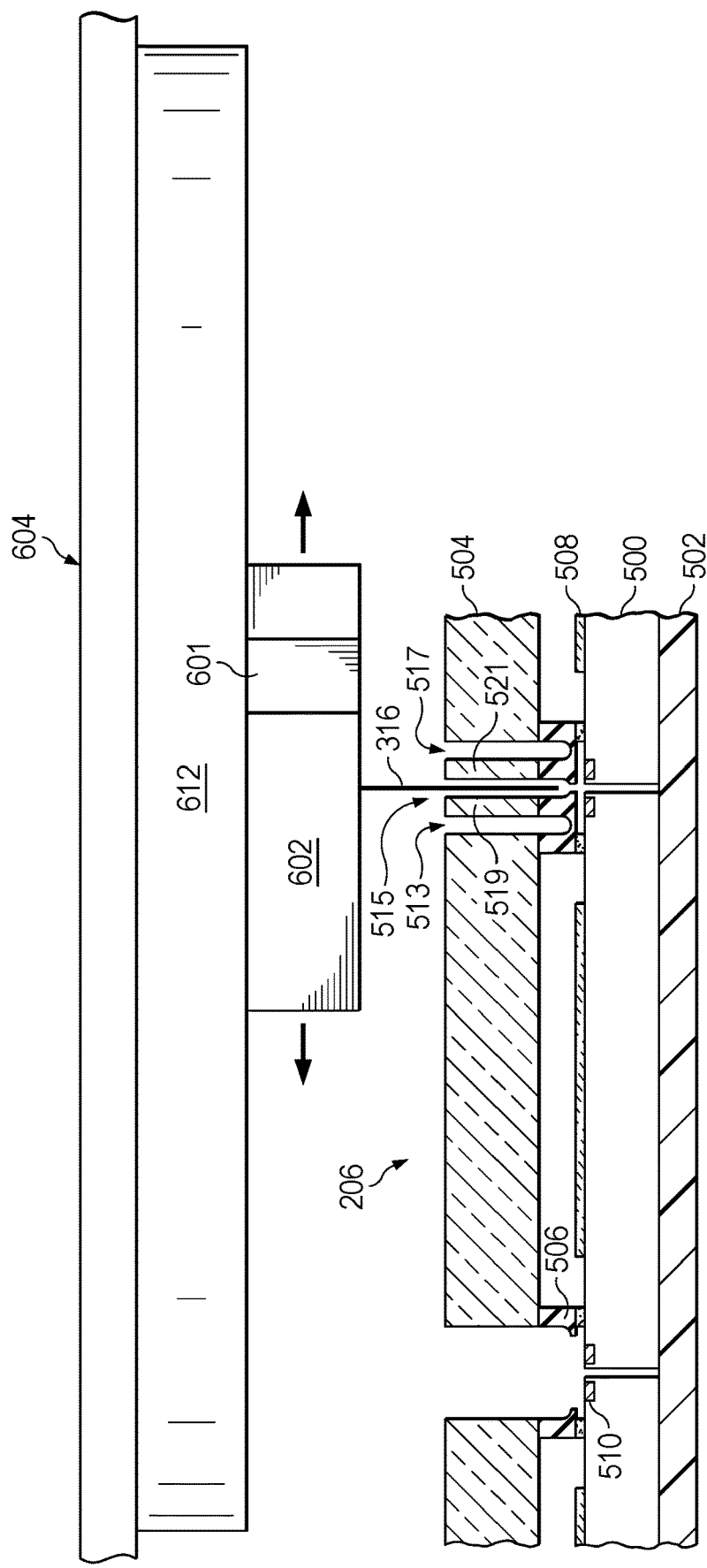
FIG. 8D1

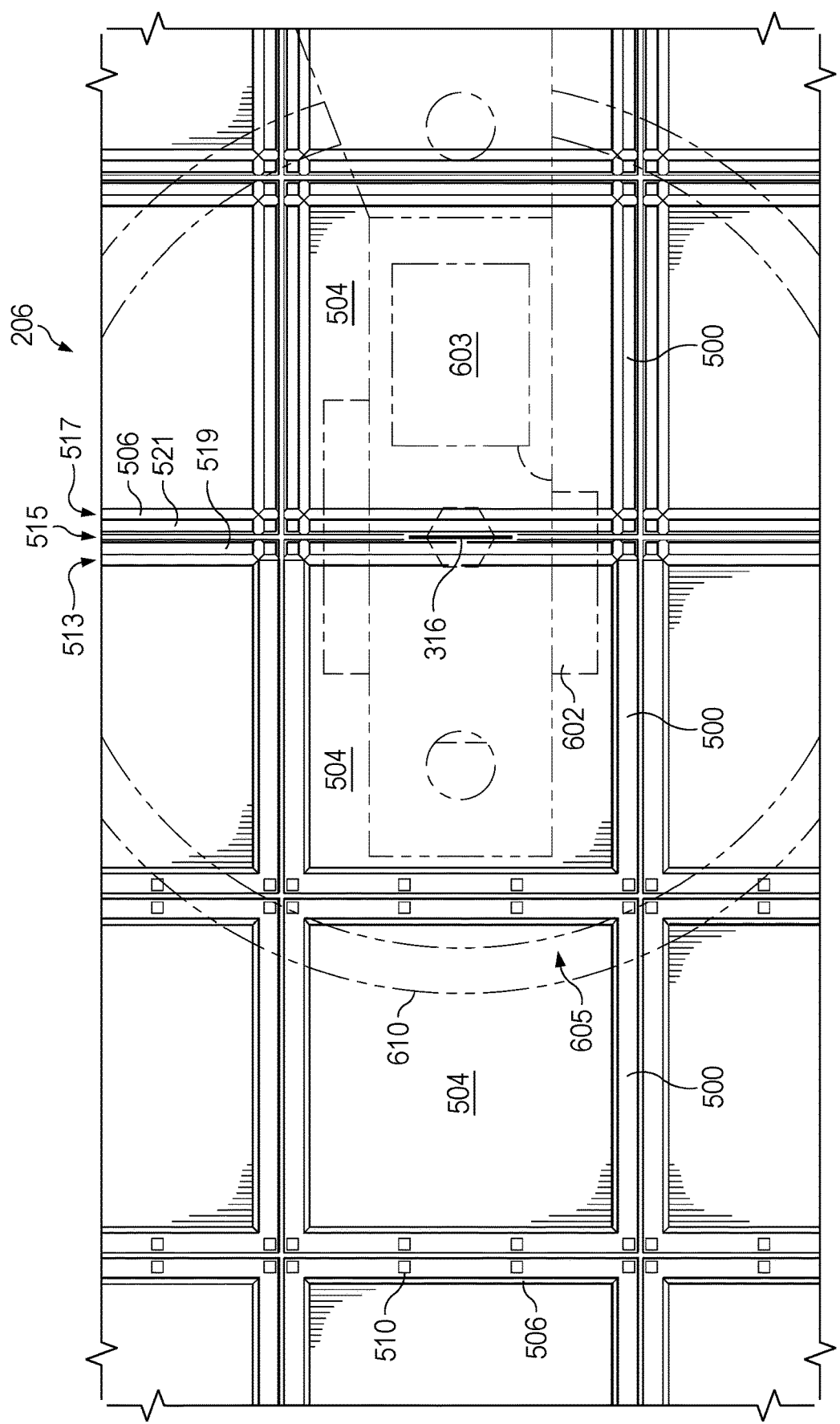
FIG. 8D2

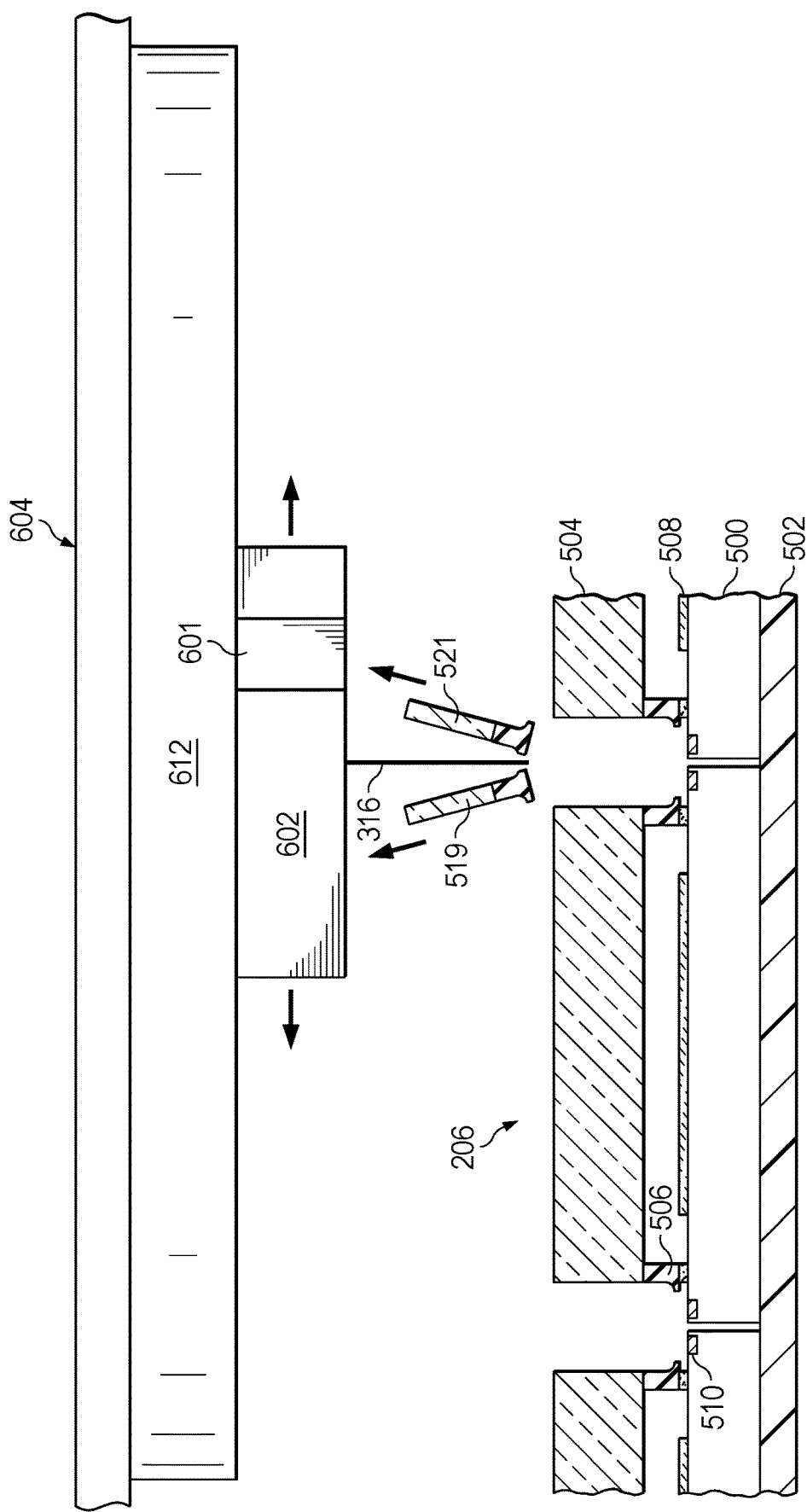
FIG. 8E1

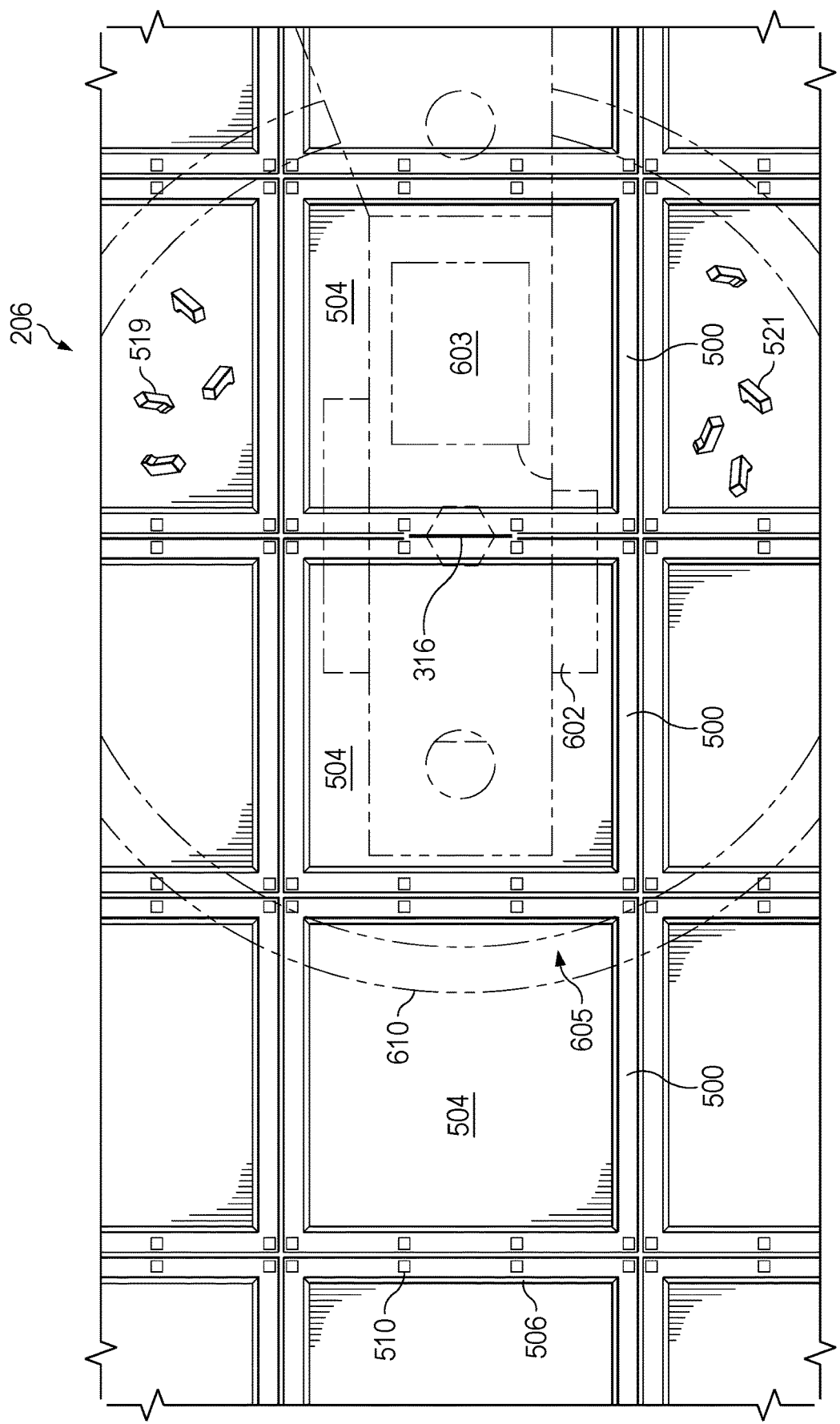
FIG. 8E2

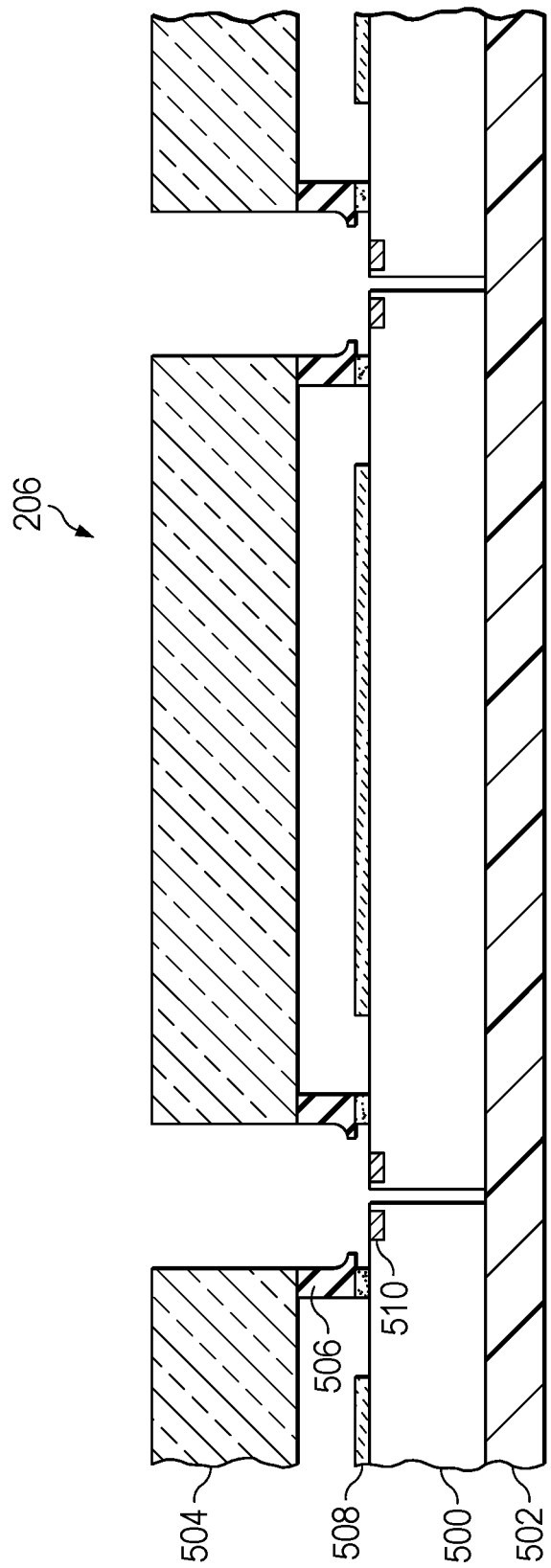
FIG. 8F1

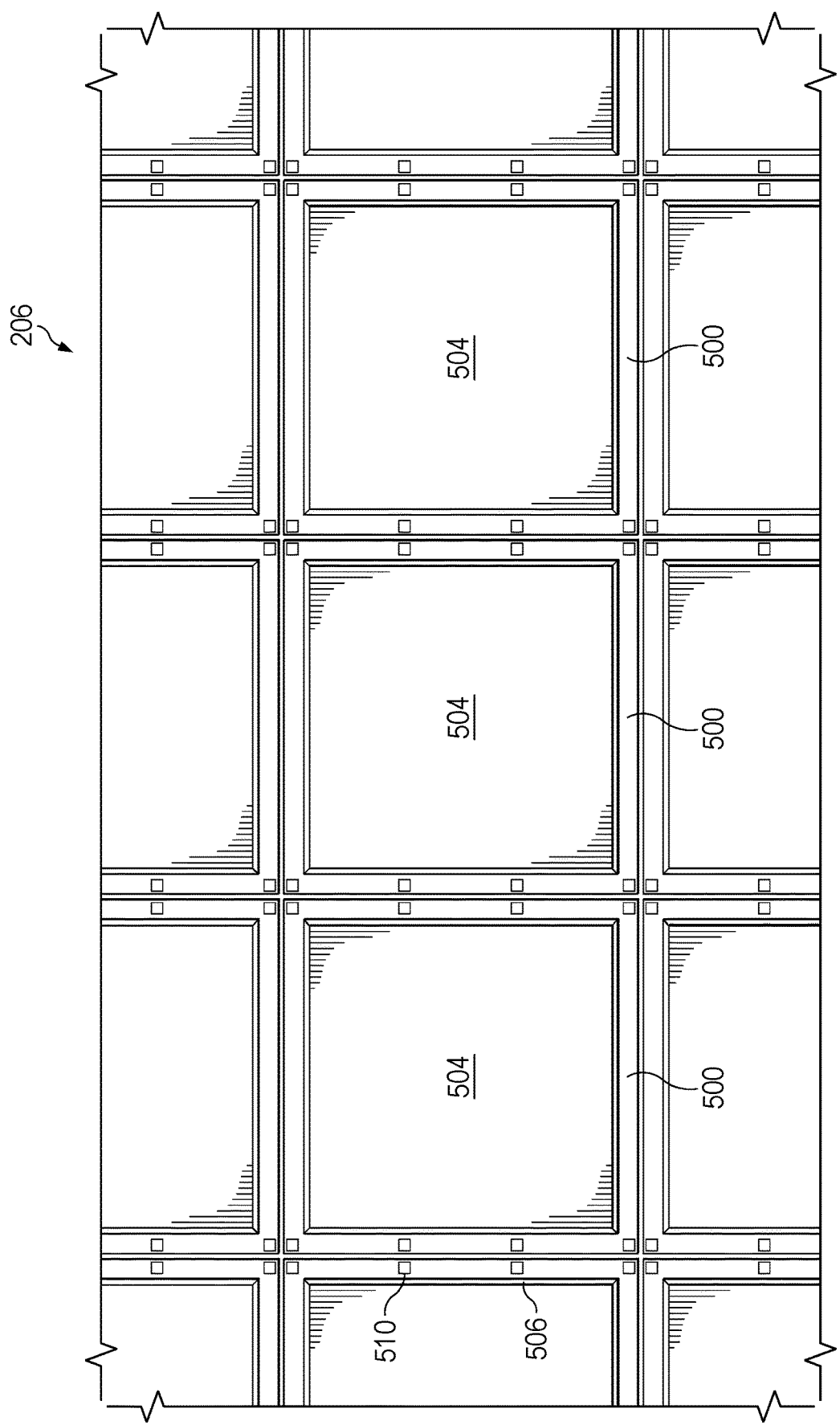
FIG. 8F2

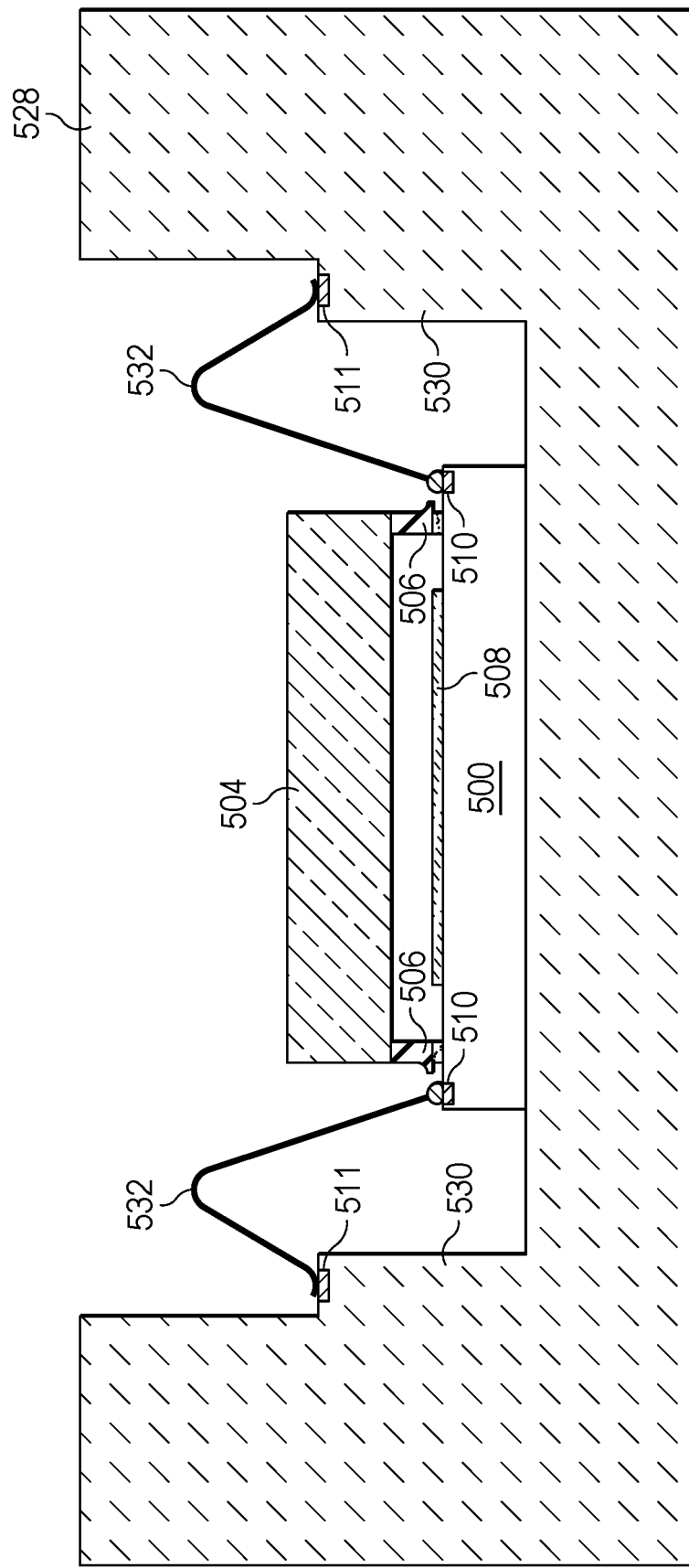
FIG. 8G1

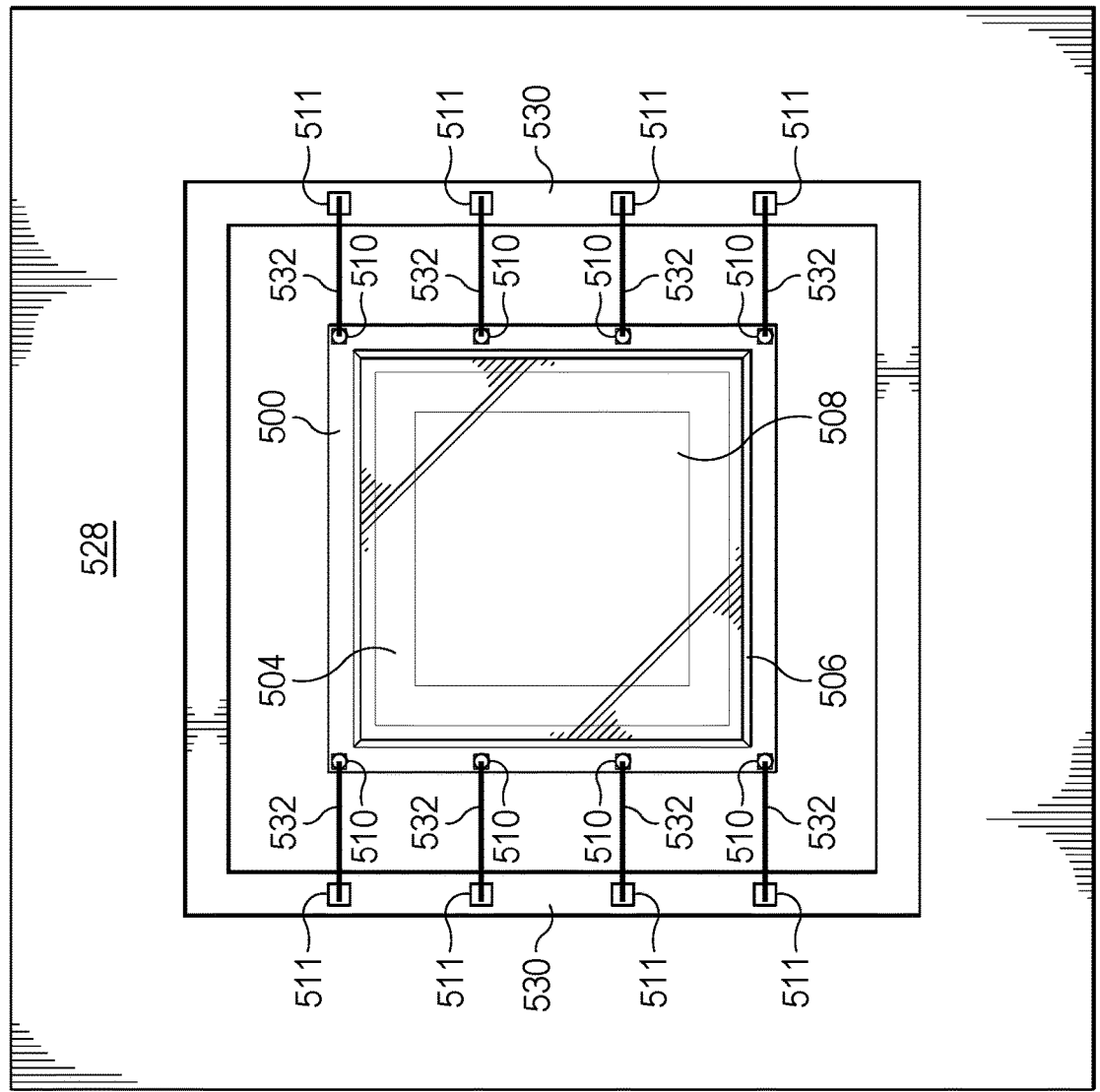
FIG. 8G2

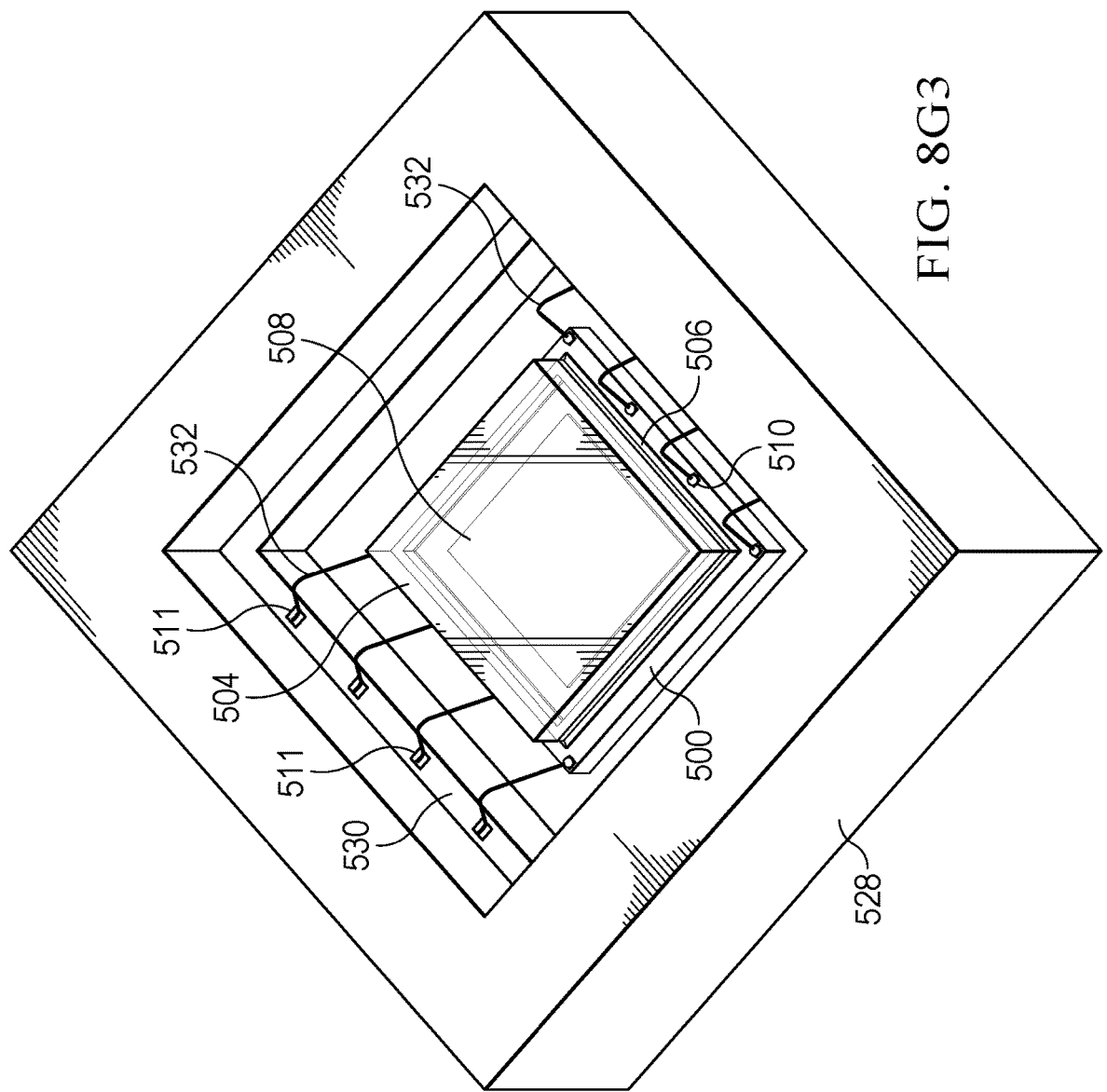
FIG. 8G3

AUTOMATED OVERLAY REMOVAL DURING WAFER SINGULATION

CROSS-REFERENCE TO RELATED APPLICATIONS

The present application claims priority to U.S. Provisional Patent Application No. 63/302,295, which was filed Jan. 24, 2022, is titled "A Method To Automate Wafer Level Package Die Singulation And Bond Pad Exposure," and is hereby incorporated herein by reference in its entirety.

BACKGROUND

Semiconductor chips are often housed inside semiconductor packages that protect the chips from deleterious environmental influences, such as heat, moisture, and debris. A packaged chip communicates with electronic devices outside the package via conductive terminals, such as leads, that are exposed to surfaces of the package. Within the package, the chip may be electrically coupled to the conductive terminals using any suitable technique. One such technique is the "flip-chip" technique, in which the semiconductor chip (also called a "die") is oriented so the device side of the chip (in which circuitry is formed) is facing downward. The device side is coupled to the conductive terminals using, e.g., solder bumps. Another technique is the wirebonding technique, in which the device side of the semiconductor chip is oriented upward and is coupled to the conductive terminals using bond wires. Wirebonds are formed on bond pads, which are positioned on semiconductor dies and provide interfaces between the wirebonds and circuitry of the semiconductor dies.

SUMMARY

In some examples, a device comprises a wafer chuck, a member having a surface facing the wafer chuck, a blade supported by the surface, a first vacuum nozzle extending through the member and having a first vacuum orifice facing a same direction as the surface, and a second vacuum nozzle extending through the member and having a second vacuum orifice facing the same direction as the surface. The first and second vacuum orifices are on opposing sides of the blade.

In some examples, a method for manufacturing a semiconductor package comprises forming first and second vertical orifice triads in a multi-wafer assembly including a glass wafer coupled to a semiconductor wafer by multiple interposers to produce a semiconductor device. The method includes inserting a blade of a wafer prober device in a first vertical orifice of the first vertical orifice triad. The method includes dislodging a first member of the assembly using the blade to expose a first bond pad, removing the first member using a vacuum, inserting the blade of the wafer prober device in a second vertical orifice of the second vertical orifice triad, dislodging the second member of the assembly using the blade to expose a second bond pad, removing the second member using the vacuum, and wirebonding the first and second bond pads to conductive terminals of a ceramic package body.

BRIEF DESCRIPTION OF THE DRAWINGS

FIG. 2 is a profile view of a test head and wafer chuck assembly, in accordance with various examples.

FIGS. 3A-3H are various views of a test head assembly, in accordance with various examples.

FIGS. 5A1-5D3 are a process flow for manufacturing a semiconductor package, in accordance with various examples.

FIGS. 6A-6E are various views of a test head assembly, in accordance with various examples.

FIGS. 8A1-8G3 are a process flow for manufacturing a semiconductor package, in accordance with various examples.

DETAILED DESCRIPTION

Figure 1A:
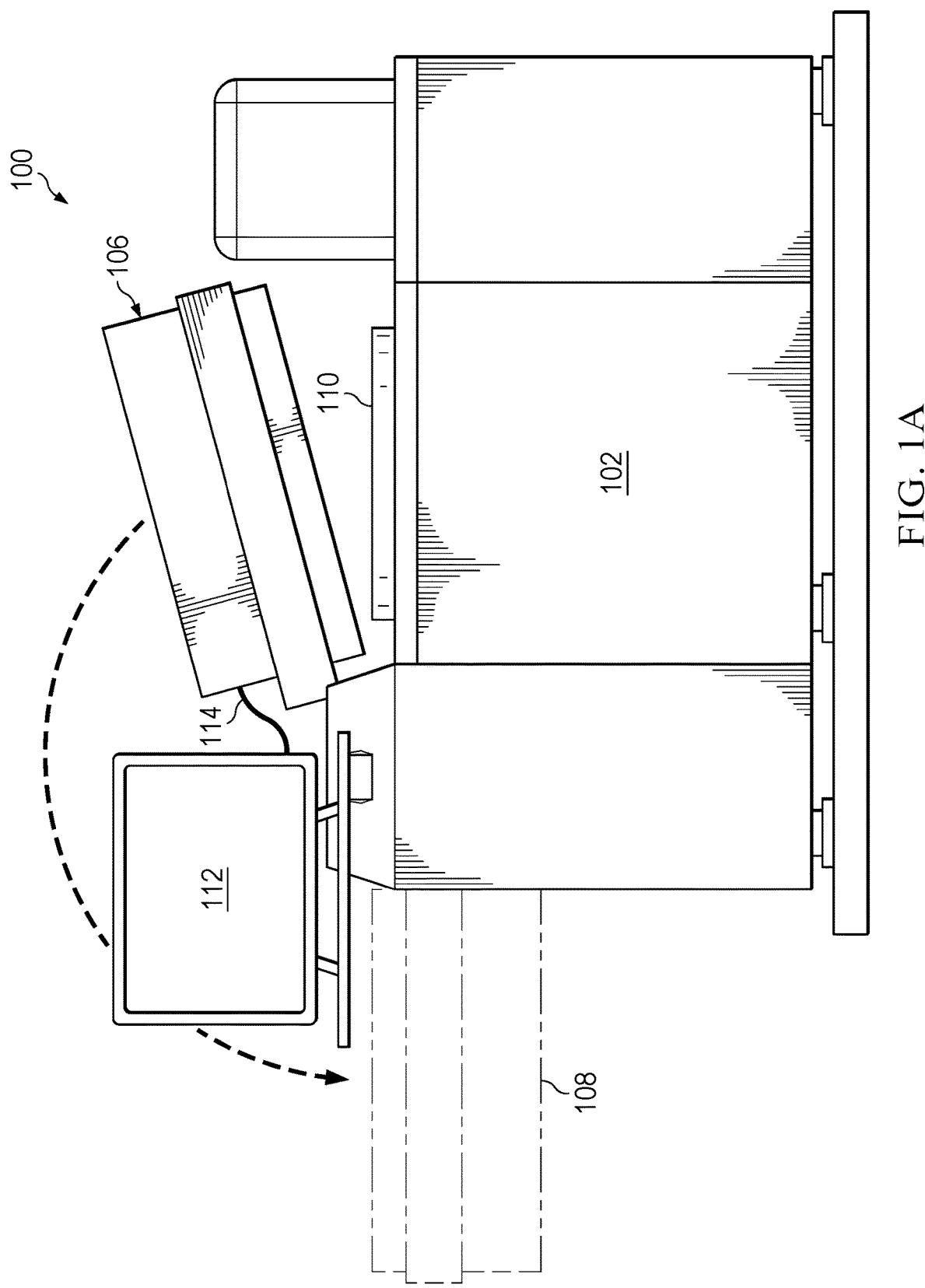
FIGS. 1A and 1B are profile and top-down views of a semiconductor wafer prober device, in accordance with various examples.

Prior to inclusion in a semiconductor package, a semiconductor die is produced by singulating a semiconductor wafer. Some wafers are readily singulated, for example, using a sawing or laser technique. However, some wafers are formed for specialized applications, as is the case with certain microelectromechanical systems (MEMS) devices. For example, some MEMS devices include a semiconductor wafer having multiple mirrors positioned thereupon and having a glass wafer positioned above the mirrors using multiple interposers. The glass wafer protects the underlying mirrors. Such a structure is readily singulated by using a saw or laser process to cut through the glass and semiconductor wafers. However, such singulation does not expose the bond pads of the semiconductor wafer that is below the glass wafer, as such bond pads are covered by the interposers used to position the glass wafer above the semiconductor wafer. To expose these bond pads on the semiconductor wafer, the interposers above the bond pads may be removed. Removal of such interposers (and other material, such as glass) obstructing access to the bond pads on the semiconductor wafer can be achieved through various techniques.

This disclosure describes various examples of semiconductor wafer prober devices (SWPDs) for automating bond pad exposure in multi-wafer assemblies (e.g., glass wafers and semiconductor wafers coupled to each other by interposers). An example SWPD includes a wafer chuck configured to support a multi-wafer assembly including a glass wafer coupled to a semiconductor wafer by multiple interposers. The example SWPD includes a probe card or other circular or non-circular member adapted to couple to a test head and a blade supported by the probe card. When inserted between a pair of members of the multi-wafer assembly that is obstructing access to the semiconductor wafer bond pads and translated back and forth along a single axis, the blade is configured to dislodge the pair of members. A vacuum nozzle extends through the probe card and has an orifice facing the multi-wafer assembly. The vacuum removes the dislodged pair of members. In this manner, the bond pads of the semiconductor wafer are exposed and are accessible for wirebonding. In some examples, the vacuum removes the dislodged pair of members as the blade dislodges the members. In other examples, the vacuum is horizontally offset from the blade such that the blade dislodges a first pair of members and then is translated laterally to dislodge a second pair of members, and the vacuum removes the first pair of members as the blade dislodges the second pair of members.

The process may be repeated multiple times for each multi-wafer assembly to produce multiple dies, and these dies may subsequently be included within semiconductor packages (e.g., ceramic packages). A SWPD having a blade and one or more vacuums as described herein mitigates the disadvantages described above through automation, which increases yield, precision, speed, and efficiency and reduces process variation and labor costs. These advantages are achieved at least in part because of the repeatability that automation provides. For example, the use of strain gauges as described herein is especially useful to collect data that, in turn, may be used to precisely calibrate force and depth of blade wafer cuts to maximize manufacturing yield. After this calibration is complete, the automated system can repeat the same wafer cuts with a high level of precision, thereby improving efficiency, speed, and lowering costs. The examples described herein provide significant economic benefits as well, with manufacturing yield improvements capable of saving semiconductor manufacturers millions of dollars, reducing customer returns, and improving manufacturer reputation for quality.

FIG. 1A is a profile view of a semiconductor wafer prober device (SWPD) 100, in accordance with various examples. The SWPD 100 may be useful to test the operation of circuitry formed on a semiconductor wafer. The SWPD 100 also may be useful to automatically expose bond pads on a multi-wafer assembly by dislodging members obstructing access to the bond pads and removing the dislodged members using a vacuum. Exposing the bond pads facilitates wirebonding during the semiconductor package manufacturing process. The SWPD 100 may include a body 102 configured to store and/or manipulate wafers, a test head 106 coupled by a hinge to the body 102 (with numeral 108 indicating the test head 106 in an optional open position), a wafer chuck 110 supported by the body 102, and a display 112 coupled to the body 102 and the test head 106 by way of cables 114. The body 102 may position a multi-wafer assembly on the wafer chuck 110. The test head 106 may include various components that facilitate the coupling of a probe card to the multi-wafer assembly on the wafer chuck 110. The probe card provides an interface between the SWPD 100 and the multi-wafer assembly on the wafer chuck 110. The display 112 (e.g., a touchscreen) may be used to operate the SWPD 100.

Figure 1B:
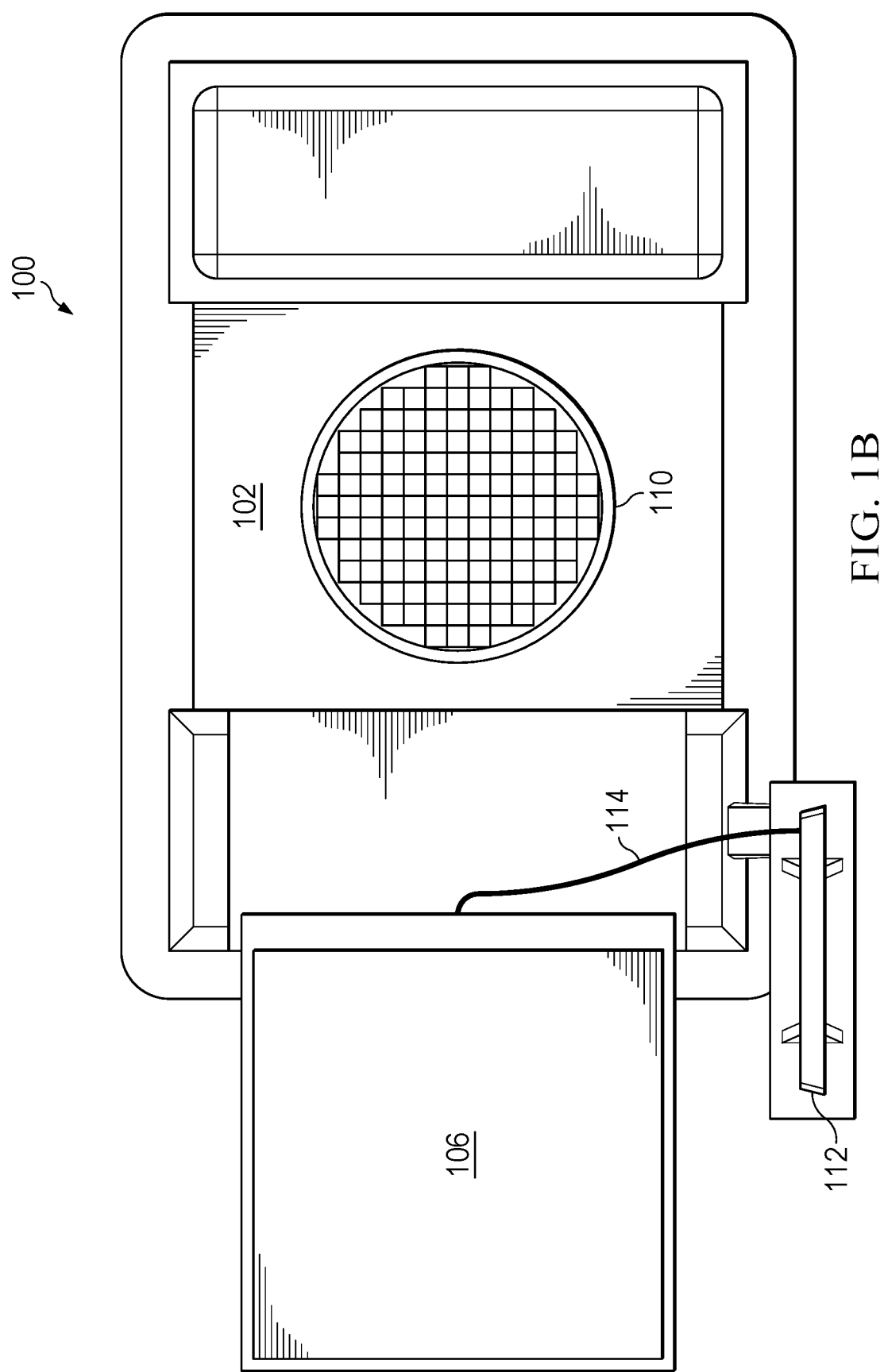

In some examples, the probe card includes a blade and is coupled to vacuum nozzles. The SWPD 100 is configured to automatically (i.e., without human intervention) use the blade to dislodge members of a multi-wafer assembly on the wafer chuck 110 that obstruct access to semiconductor wafer bond pads and to use a vacuum to remove the dislodged members. The SWPD 100 repeatedly indexes the blade to a different pair of members of the multi-wafer assembly to be dislodged and then vacuums the dislodged members. FIG. 1B is a top-down view of the structure of FIG. 1A.

FIG. 2 is a profile view of the test head 106 and the wafer chuck 110, in accordance with various examples. The test head 106 includes a body 107, a performance board 200, and an interface 202 including various components (e.g., board stiffener, pogo or pin tower, probe card stiffener, lock ring, headplate) that may vary depending on the specific application for which the SWPD 100 is being used. The test head 106 further includes a probe card 204 that is coupled to the interface 202, for example, by fastening members or other coupling structures (not expressly shown) that leave sufficient clearance for structures positioned above the probe card 204, such as the mechanical arm, plates, memory devices, etc. described herein. A multi-wafer assembly 206 rests on and is coupled to the wafer chuck 110, which may be supported by any of a variety of structures within the body 102. One or more vacuum hoses may extend through channels formed in the test head 106 and interface 202 may be adapted with suitably sized orifices to enable the vacuum hoses to extend therethrough toward the probe card 204. One end of each vacuum hose may terminate in a vacuum nozzle and an orifice that is coincident with the probe card, and an opposite end of each such vacuum hose may be coupled to a container to collect dislodged wafer members and other debris. Further, the test head 106 may include various circuitry, controllers, processors, memory, etc. to collect data from sensor equipment (such as the strain gauges described herein).

Figure 3A:
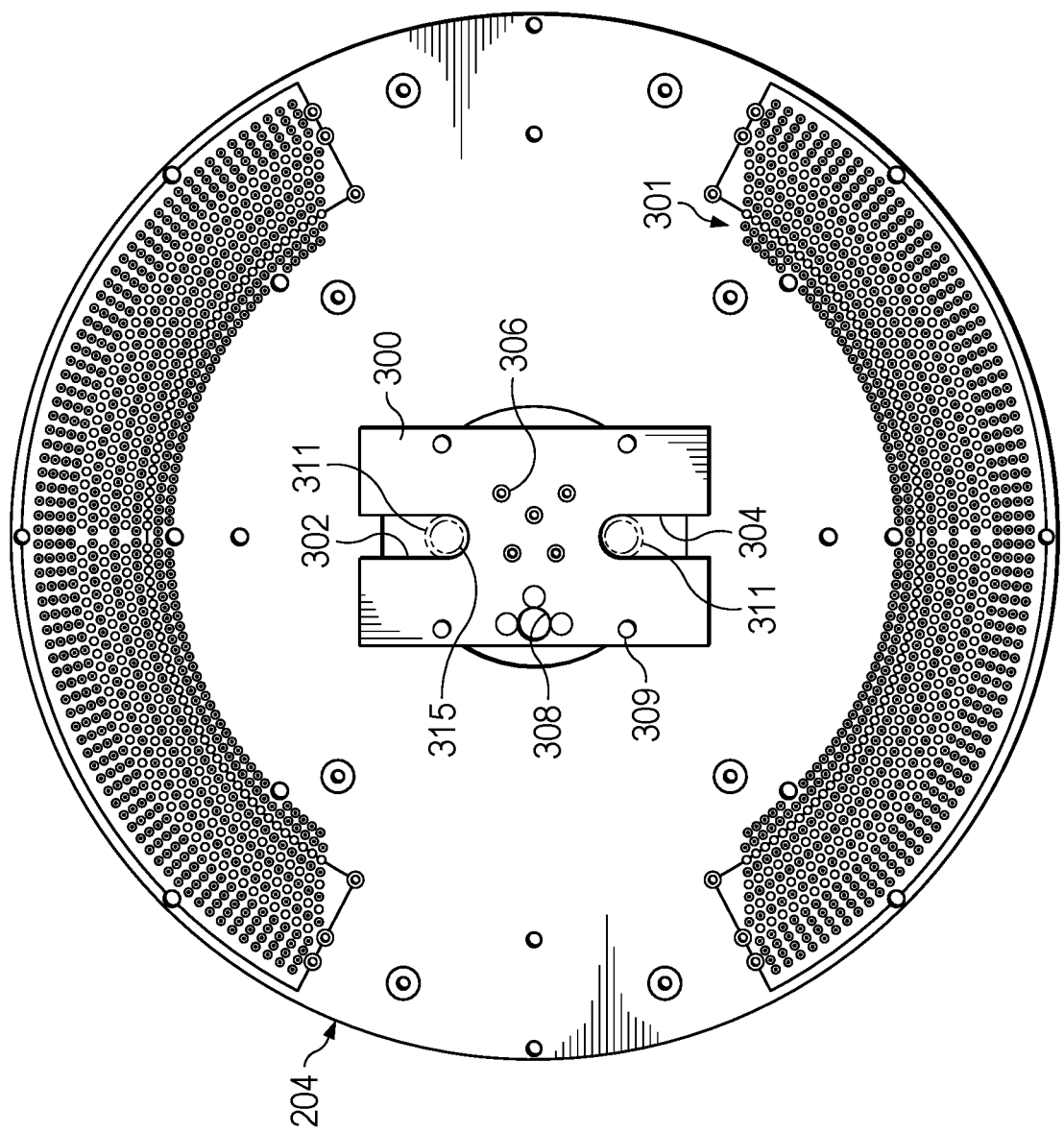

FIG. 3A is a top-down view of the probe card 204, in accordance with various examples. The probe card 204 includes multiple conductive terminals 301 that extend through a thickness of the probe card 204 and may, in some cases, facilitate communication with and testing of circuitry on a semiconductor wafer positioned below and in contact with the probe card 204. The probe card 204 further includes a base member 300 having vacuum ports 302, 304, a set of fastening members 306, a dial gauge port 308, and a set of fastening members 309. Vacuum hoses 311 extend toward the vacuum ports 302, 304, with vacuum nozzles 313 (not clearly visible in FIG. 3A but depicted in FIG. 3B) coupling to the vacuum ports 302, 304. The vacuum nozzles 313 and the vacuum ports 302, 304 may be sized and shaped relative to each other so as to facilitate a snug fit and to prevent inadvertent detachment. The vacuum nozzles 313 terminate at vacuum orifices 315, which are more readily viewed in FIG. 3B. Although the use of a probe card 204 is assumed in this disclosure, in at least some examples, a structure similar in shape to the probe card 204 but lacking the conductive terminals of the probe card 204 may be used. In yet other examples, a different structure not resembling the size, shape, or function of the probe card 204 may be used. The probe card 204 may be adapted to be coupled to supporting structures, such as to the remainder of the test head 106 or, in some examples, the body 102, or a combination thereof, using various orifices that are shown in the drawings (e.g., in FIG. 3A) but that are not specifically marked with numerals.

Figure 3B:
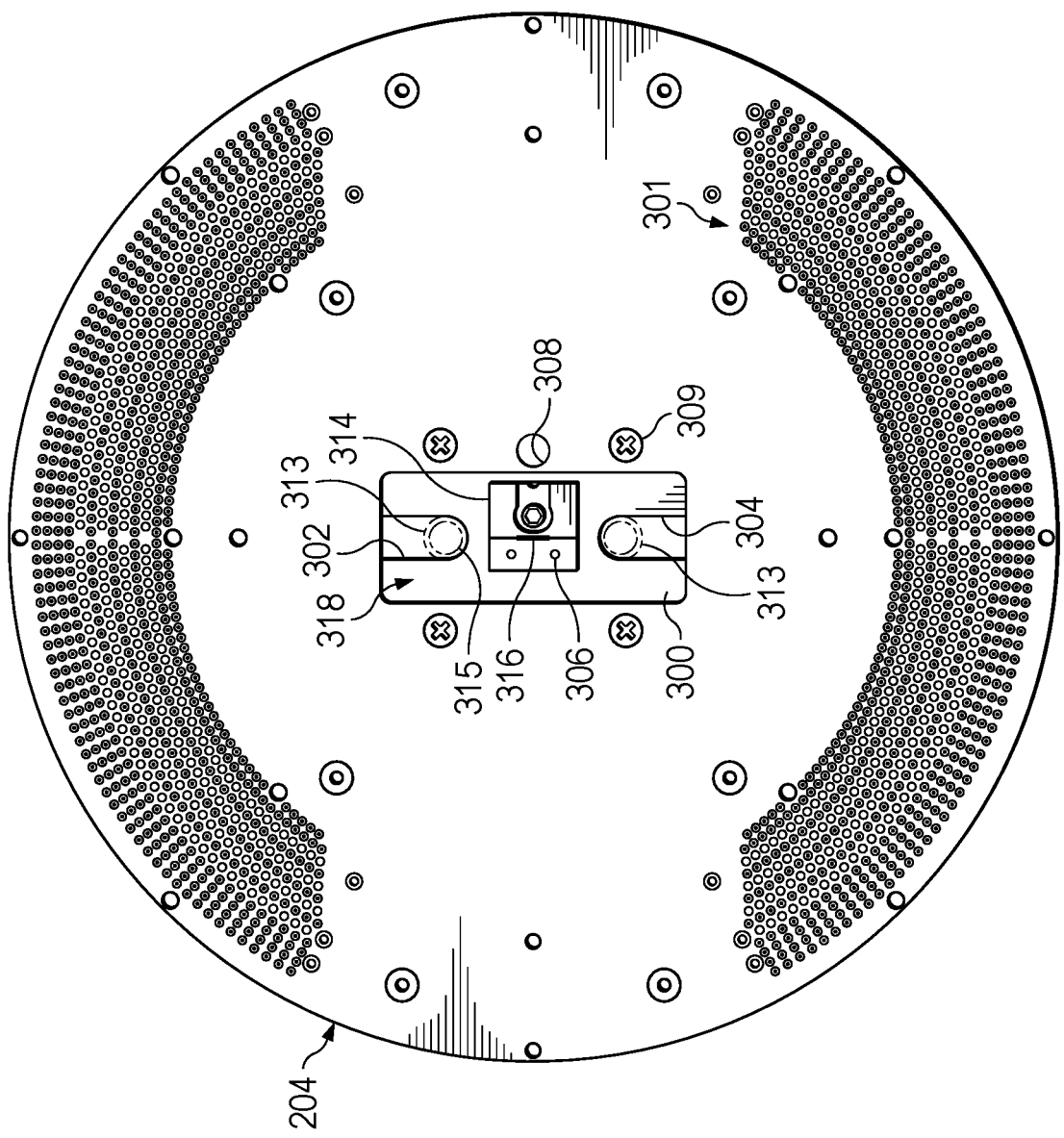

FIG. 3B is a bottom-up view of the probe card 204. The base member 300 is coupled to a blade extension member 314 by the set of fastening members 306. The base member 300 and the blade extension member 314 support a blade 316. The set of fastening members 309 are coupled to the probe card 204, thereby fastening the base member 300 to the probe card 204. In examples, the base member 300 is not flush with the bottom surface of the probe card 204. For example, a cavity 318 may be present as a result of the base member 300 being mounted on the top surface of the probe card 204, as shown in FIG. 3A. In other examples, the base member 300 is flush with one or both the top and bottom surfaces of the probe card 204.

The vacuum ports 302, 304 are depicted as having right angles on one end and an arch shape on the opposing end. The scope of this disclosure is not limited to such a shape. The vacuum ports 302, 304 may have any suitable shape and size that facilitates the coupling of vacuum nozzles thereto and the removal of dislodged wafer members and other debris from the multi-wafer assembly, as described below. Although the vacuum ports 302, 304 may have any suitable shape and size, the vacuum ports 302, 304 are, at a minimum, shaped and sized to enable the transport of dislodged wafer members being removed from a multi-wafer assembly, as described below. Accordingly, the vacuum ports 302, 304 should have a cross-sectional area at least as large as the maximum area that can be occupied by a pair of wafer members, and in some examples, the vacuum ports 302, 304 have a cross-sectional area at least four times the maximum area that can be occupied by the pair of wafer members.

Figure 3E:
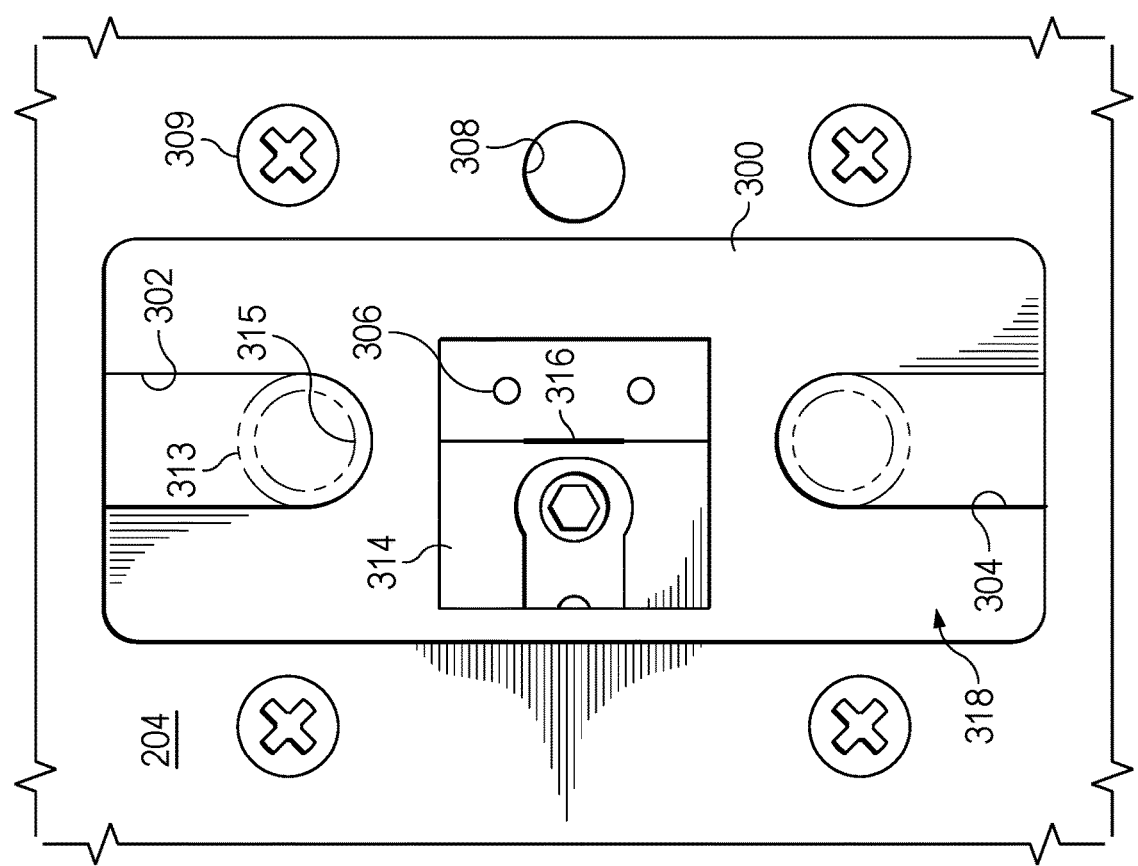

In some examples, the blade 316 is composed of metal or a metal alloy, such as tool steel. In some examples, the blade 316 is composed of another material, such as tungsten. In some examples, the blade 316 lies in a plane that is orthogonal to the bottom surface of the probe card 204 (between 85 and 95 degrees relative to the probe card 204 or another surface substantially parallel to the probe card 204, such as the bottom surface of the blade extension member 314). In some examples, the blade 316 lies in a plane that is coincident with the vacuum ports 302, 304. In some examples, the blade 316 lies in a plane that is not coincident with either of the vacuum ports 302, 304. In examples, the blade 316 has a width ranging from 3 mm to 20 mm, a length ranging from 5 mm to 15 mm, and a thickness ranging from 200 microns to 300 microns. Relative to these ranges, a blade 316 that is excessively thin, that is excessively large, or that is composed of an unsuitable material may cause damage to or break the blade 316 during dislodging of wafer members. Similarly, such a blade could damage or break, instead of dislodge, wafer members that are to be dislodged. The specific dimensions of the blade 316 may vary depending on the material of which the blade 316 is composed. For example, a stronger metal may enable a thinner blade 316, and vice versa. Other factors, such as the dimensions of the multi-wafer assembly having the bond pads that are to be exposed, may affect the dimensions of the blade 316. For example, a thicker multi-wafer assembly may result in a longer blade 316 or a blade 316 composed of a relatively stronger material. In some examples, the blade 316 may be retractable. FIG. 3C is a profile view of the probe card 204. FIGS. 3D1 and 3D2 are perspective views of the probe card 204 from above and below the probe card 204, respectively. FIG. 3E is a close-up view of the blade 316 and the vacuum ports 302, 304. As shown in FIGS. 3C-3E, in some examples, blade 316 is aligned with the orifices at which the vacuum hoses 311 terminate, as is more clearly depicted in FIG. 3F. Further, the vacuum nozzles 313 may be sized relative to the vacuum ports 302, 304 such that the vacuum nozzles 313 are press-fit into the vacuum ports 302, 304.

Figure 3F:
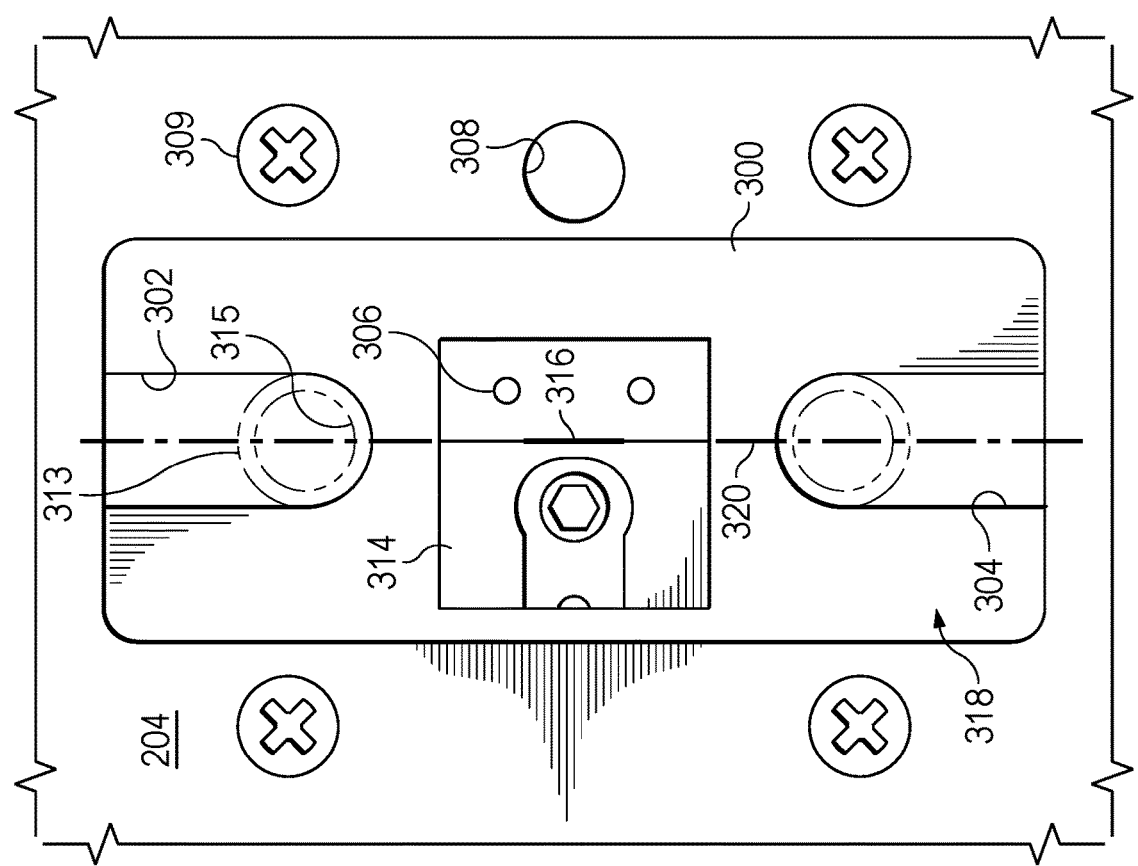
Figure 3G:
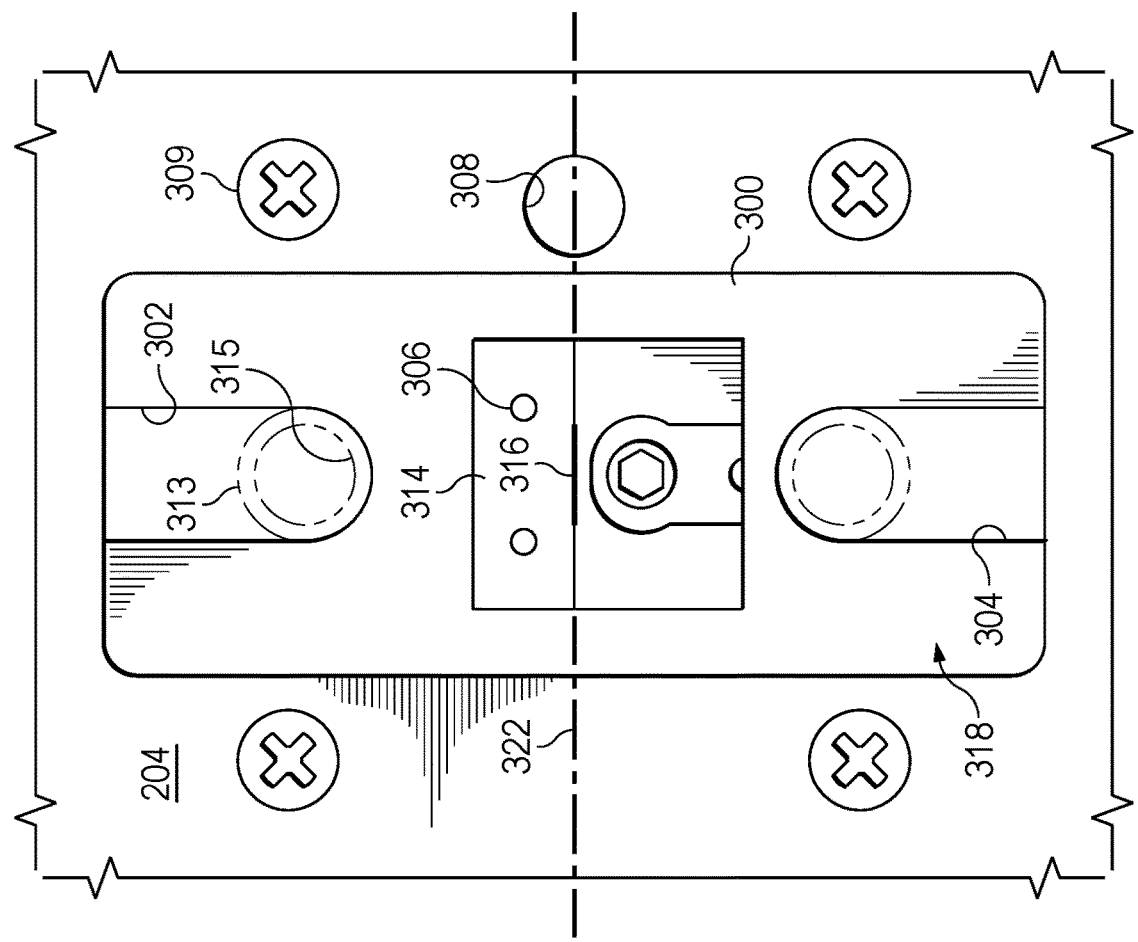
Figure 3H:
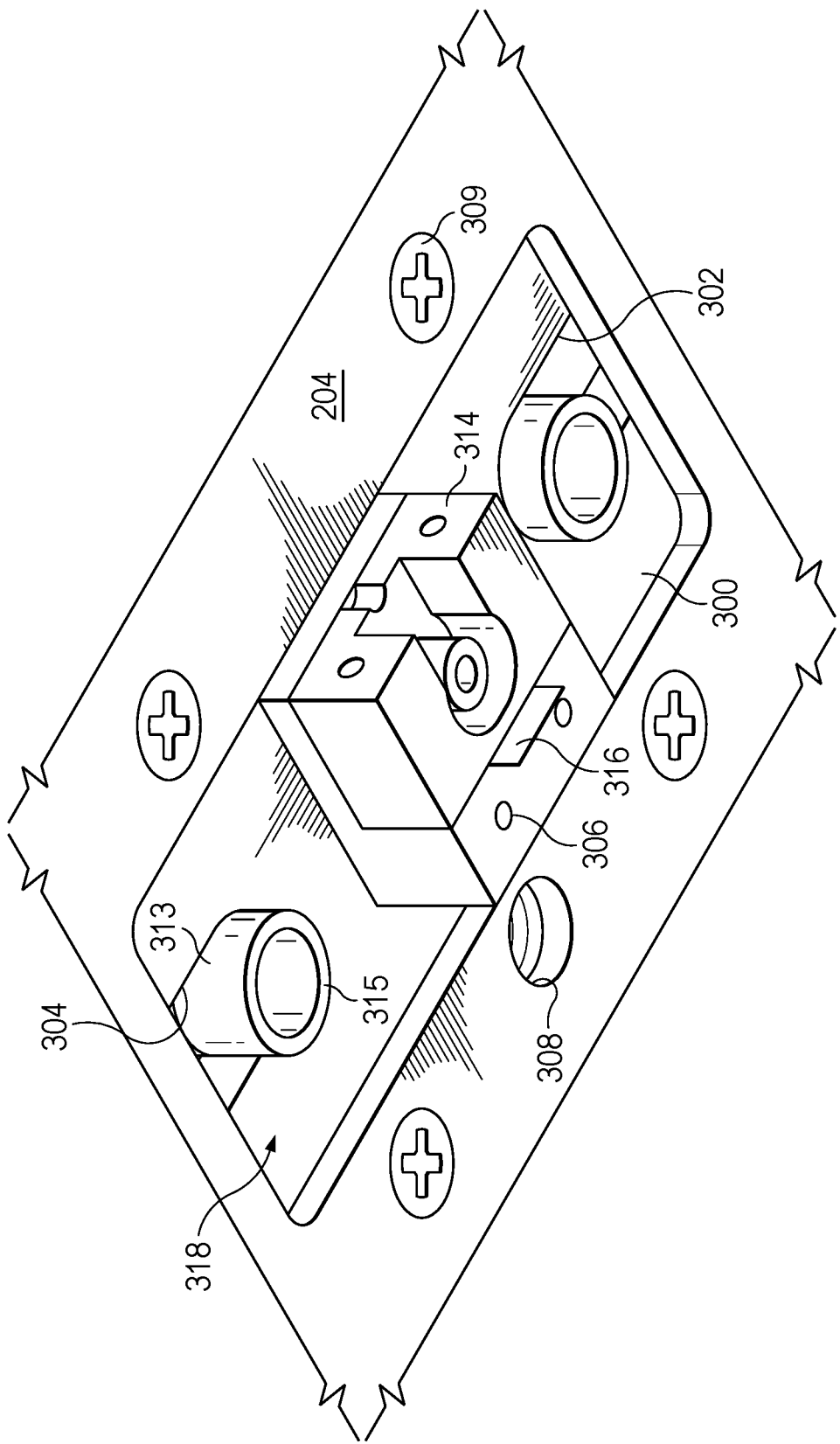

The blade 316 may be oriented in different directions, depending on the manner in which the blade is to be indexed relative to the multi-wafer assembly. For example, the blade 316 may be oriented in a direction that is parallel with the vacuum orifices 315, in which case the multi-wafer assembly and/or the blade 316 may be moved in a first direction relative to each other after each pair of wafer members has been dislodged by the blade 316. In other examples, the blade 316 may be oriented in a direction that is orthogonal to the vacuum orifices 315, in which case the multi-wafer assembly and/or the blade 316 may be moved in a second direction relative to each other after each pair of wafer members has been dislodged by the blade 316. In either case, the relative movement between the multi-wafer assembly and the probe card 204 may be such that a vacuum orifice 315 removes the dislodged members at the time of dislodging or immediately thereafter. FIG. 3F depicts the blade 316 oriented in a first direction such that a plane 320 extends through the blade 316 and is coincident with the vacuum orifices 315. In contrast, FIG. 3G depicts the blade 316 oriented in a second direction such that a plane 322 extends through the blade 316 and is not coincident with the vacuum orifices 315. Other configurations of the blade 316 and the vacuum orifices 315 are contemplated and included in the scope of this disclosure. FIG. 3H is a perspective view of the blade 316 and the vacuum orifices 315 in the configuration of FIG. 3F. As shown in FIGS. 3F-3H, the blade extension member 314 is coupled to the base member 300. In examples, the blade extension member 314 is soldered to the base member 300. In examples, the blade extension member 314 and the base member 300 are parts of a monolithic structure. In examples, the blade extension member 314 is coupled to the base member 300, for example, using fastening members such as screws.

Figure 4:
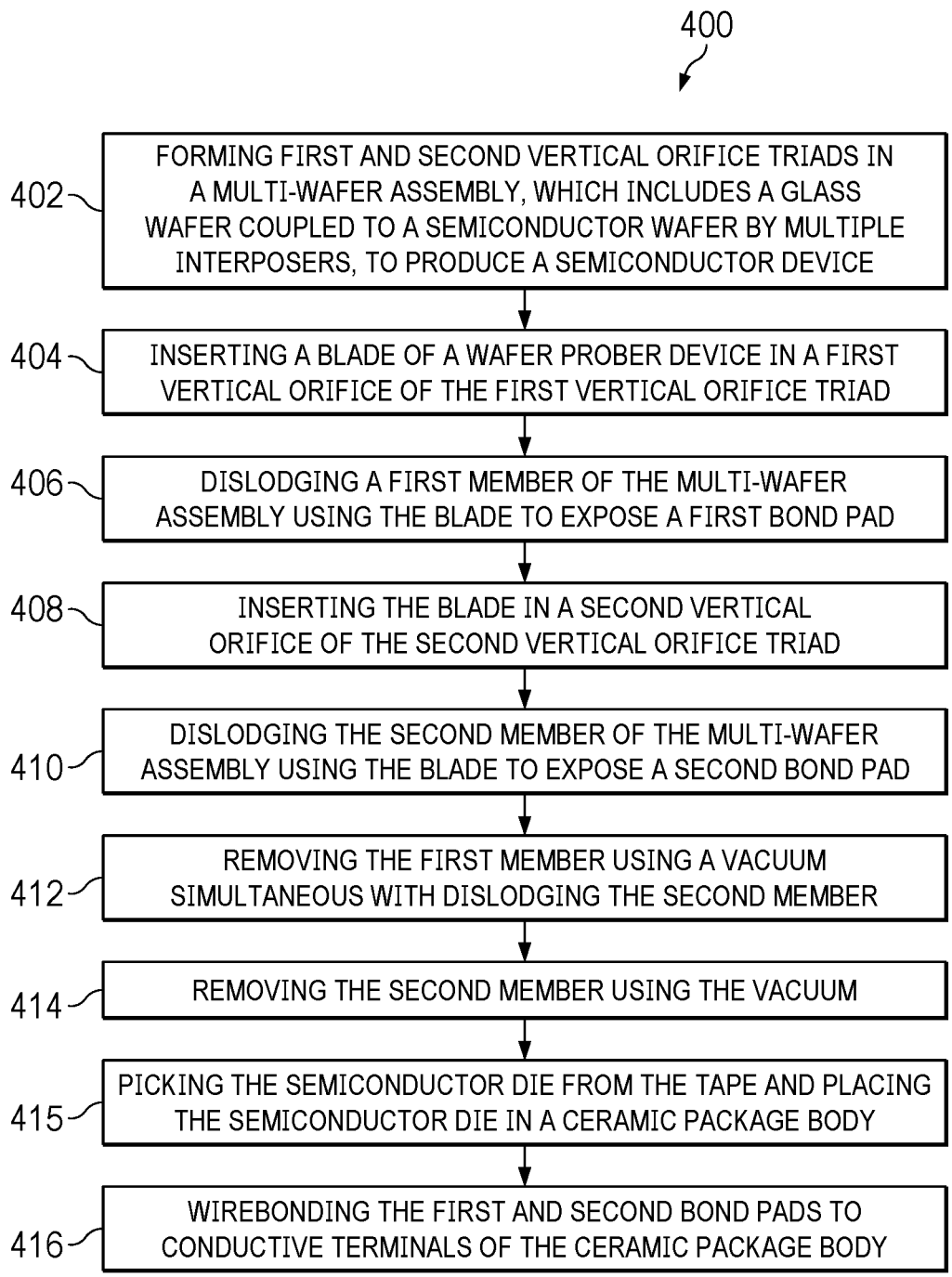
FIG. 4 is a flow diagram of a method for manufacturing a semiconductor package in accordance with various examples.

FIG. 4 is a flow diagram of a method 400 for manufacturing a semiconductor package in accordance with various examples. FIGS. 5A1-5D3 are a process flow for manufacturing a semiconductor package, in accordance with various examples. Accordingly, FIGS. 4 and 5A1-5D3 are described in parallel. The method 400 begins with forming first and second vertical orifice triads in a multi-wafer assembly, which includes a glass wafer coupled to a semiconductor wafer by multiple interposers, to produce a semiconductor device (402). Step 402 may be performed by any suitable technique using any suitable apparatus. For example, step 402 may be performed using a laser or a saw. In examples, each triad of vertical orifices includes a middle vertical orifice that extends through the glass wafer, the interposers underlying the glass wafer, and the semiconductor wafer underlying the interposers. Further, each triad of vertical orifices includes left and right vertical orifices on either side of the middle vertical orifice, each of which extends through the glass wafer and into the interposers, but not through the interposers. The left and right vertical orifices in each triad of vertical orifices do not extend to the semiconductor wafer below the interposers. FIG. 5A1 depicts a profile cross-sectional view of the multi-wafer assembly 206, which includes a semiconductor (e.g., silicon) wafer 500 coupled to a tape 502, a glass wafer 504, and interposers 506 coupled therebetween. Mirrors 508 are coupled to the device side of the semiconductor wafer 500, although other MEMS devices may be substituted for the mirrors 508. Bond pads 510 are positioned on the device side of the semiconductor wafer 500. A first triad of vertical orifices 512, 514, 516 and a second triad of vertical orifices 513, 515, 517 are formed in the multi-wafer assembly 206. As described above and as shown, the middle vertical orifice 514 in the first triad of vertical orifices extends through the glass wafer 504, the interposers 506, and the semiconductor wafer 500. Similarly, the middle vertical orifice 515 in the second triad of vertical orifices extends through the glass wafer 504, the interposers 506, and the semiconductor wafer 500. In contrast, the vertical orifices 512 and 516 extend through the glass wafer 504 and through only part of the interposers 506, and similarly, the vertical orifices 513 and 517 extend through the glass wafer 504 and through only part of the interposers 506. The vertical orifices 512, 514, 516 produce wafer members 520, 522, and the vertical orifices 513, 515, 517 produce wafer members 519, 521. The wafer members 520, 522 are vertically aligned with and thus obstruct access to the bond pads 510 that are positioned below the wafer members 520, 522. Similarly, the wafer members 519, 521 are vertically aligned with and thus obstruct access to the bond pads 510 that are positioned below the wafer members 519, 521. Because the vertical orifices 514, 515 extend through the semiconductor wafer 500, the multi-wafer assembly 206 has been singulated to produce a semiconductor device (e.g., a die).

The method 400 includes inserting a blade of a wafer prober device in a first vertical orifice of the first vertical orifice triad (404). The method 400 also includes dislodging a first member of the multi-wafer assembly using the blade to expose a first bond pad (406). As shown in the profile cross-sectional view of FIG. 5B1 and the top-down view of FIG. 5B2, the SWPD 100, and specifically the blade 316, is useful to dislodge the wafer members 520, 522 when the blade 316 is inserted in the vertical orifice 514 and translated back and forth along a single axis (e.g., horizontally, for example, toward and away from the vertical orifices 513, 515, 517). Consequently, the bond pads 510 underneath the wafer members 520, 522 are exposed and accessible for wirebonding. In some examples, the blade 316 may be inserted in the vertical orifice 512 and/or the vertical orifice 516 and translated back and forth as described above along a single axis to dislodge the wafer members 520, 522.

In examples, the blade 316 is inserted into the vertical orifice 514 to an appropriate depth to facilitate dislodging of the wafer members 520, 522. If the blade 316 is inserted too deeply, the blade 316 may be damaged or may damage the semiconductor wafer 500. Conversely, if the blade 316 is not inserted deeply enough, the blade 316 may be damaged or may be ineffective in dislodging the wafer members 520, 522. To insert the blade 316 to the appropriate, predetermined depth, the blade 316 may first be calibrated, for example, by bringing the blade 316 in contact with the top surface of the glass wafer 504. To determine whether the blade 316 is at the top surface of the glass wafer 504, a dial gauge 310 having a probe 312 may be used. Specifically, the probe 312 is inserted into the dial gauge port 308 (the dial gauge port 308 is not visible in the view of FIG. 5B3, but is visible in other figures, such as FIG. 3A) as shown in FIG. 5B3, and the tip of the probe 312 is aligned with the tip of the blade 316. The dial gauge 310 may be precalibrated so that when the probe 312 contacts the top surface of the glass wafer 504 (e.g., travels a predetermined distance), the dial gauge 310 reads a predetermined number (e.g., 0.00 inches). The probe 312, the tip of which is aligned with the tip of the blade 316, is then lowered simultaneously with the blade 316 until the dial gauge 310 reads the predetermined number, which indicates that the tip of the probe 312, and hence the tip of the blade 316, is in contact with the top surface of the glass wafer 504, as shown in FIG. 5B4. The thickness of the glass wafer 504 and the interposers is known, so the blade 316, once calibrated by making contact with the top surface of the glass wafer 504, may be lowered a predetermined depth to the proper total depth in the vertical orifice 514. This process may be repeated for each wafer or for each lot of wafers.

The method 400 includes inserting the blade in a second vertical orifice of the second vertical orifice triad (408) and dislodging the second member of the multi-wafer assembly using the blade to expose a second bond pad (410). The method 400 also comprises removing the first member using a vacuum simultaneously with dislodging the second member (412). FIG. 5C1 shows that as the blade 316 dislodges the wafer members 519, 521, the vacuum nozzle 313 (and the vacuum orifice 315 associated therewith) is positioned above the dislodged wafer members 520, 522. Thus, the vacuum nozzle 313 removes the wafer members 520, 522 as the wafer members 519, 521 are dislodged. FIG. 5C2 is a top-down view of the structure of FIG. 5C1. The method 400 includes removing the second member using the vacuum (414). Thus, the wafer members 519, 521 may be removed by vacuum the same way as the wafer members 520, 522.

The method 400 includes picking the semiconductor die from the tape and placing the semiconductor die in a ceramic package body (415). The method 400 also includes wire-bonding the first and second bond pads to conductive terminals of the ceramic package body (416). FIG. 5D1 shows a profile cross-sectional view of a ceramic package having a body 528, a shelf 530 having conductive terminals 511 formed thereupon, and bond wires 532 coupling such conductive terminals 511 on the shelf 530 to the exposed bond pads 510. FIG. 5D2 is a top-down view of the structure of FIG. 5D1. FIG. 5D3 is a perspective view of the structure of FIG. 5D1. After wirebonding is complete, a lid (not expressly shown) may be coupled to the body 528 to seal and protect the contents of the package from deleterious external influences.

Figure 6A:
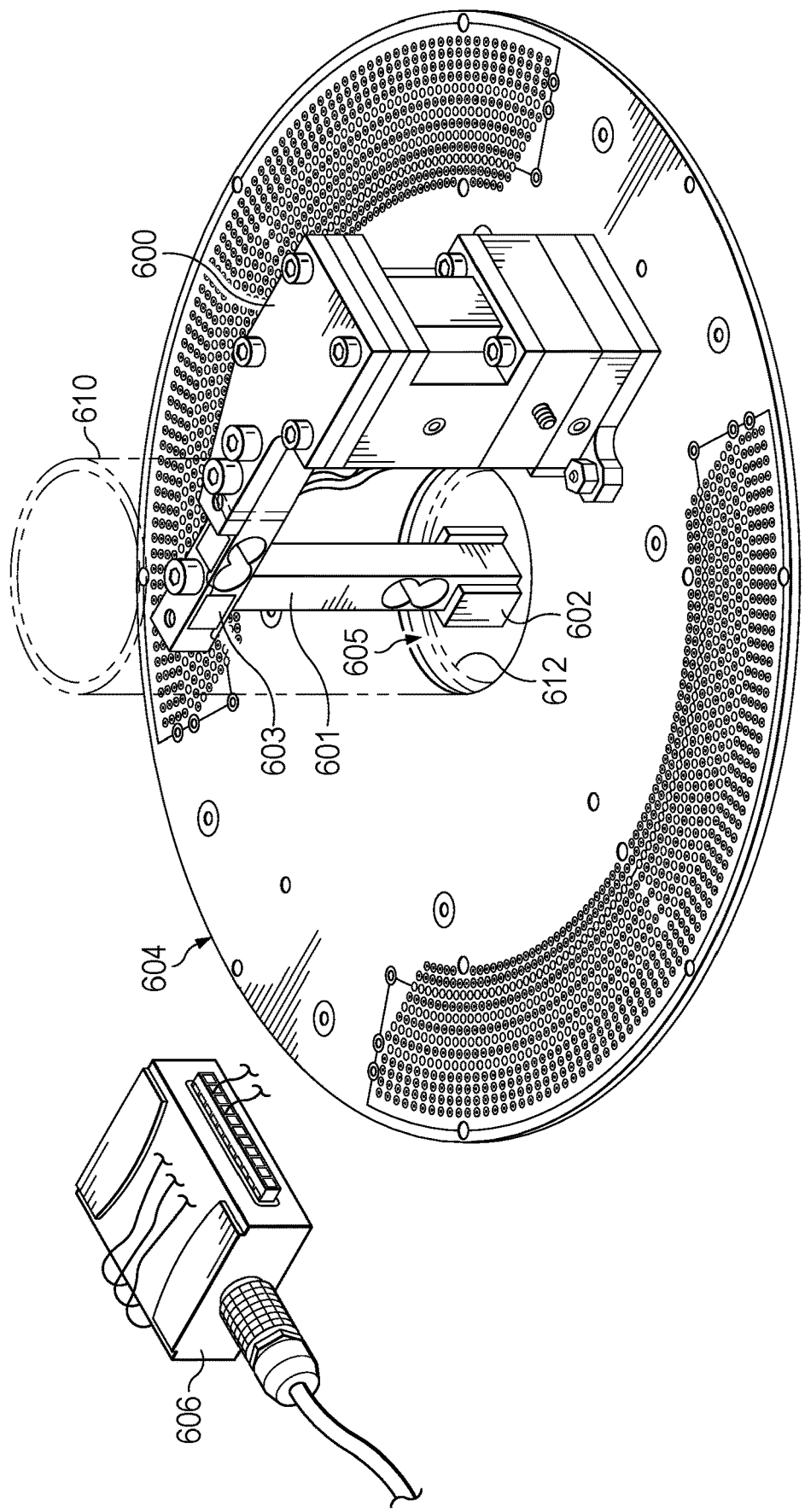
Figure 6B:
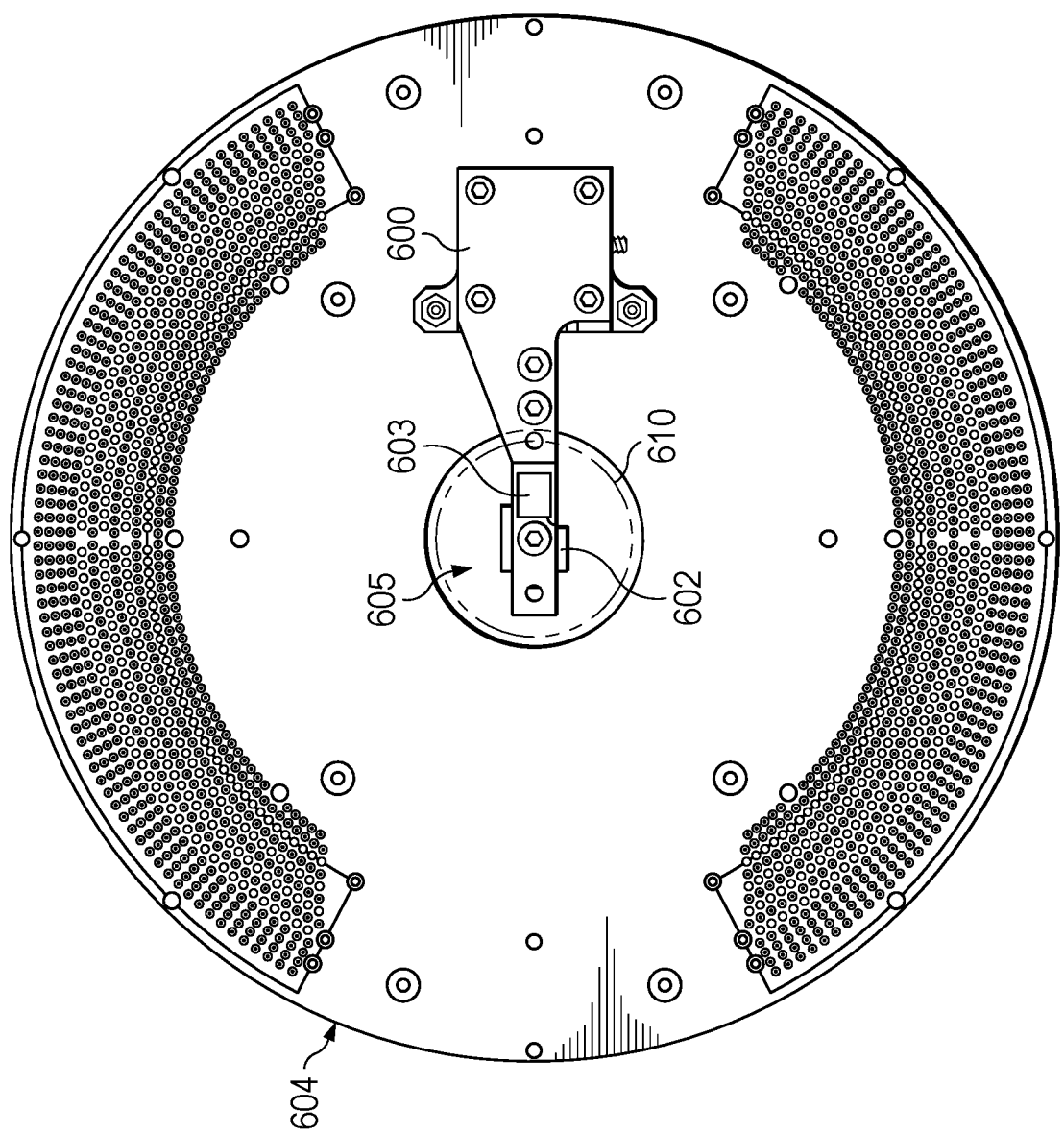
Figure 6C:
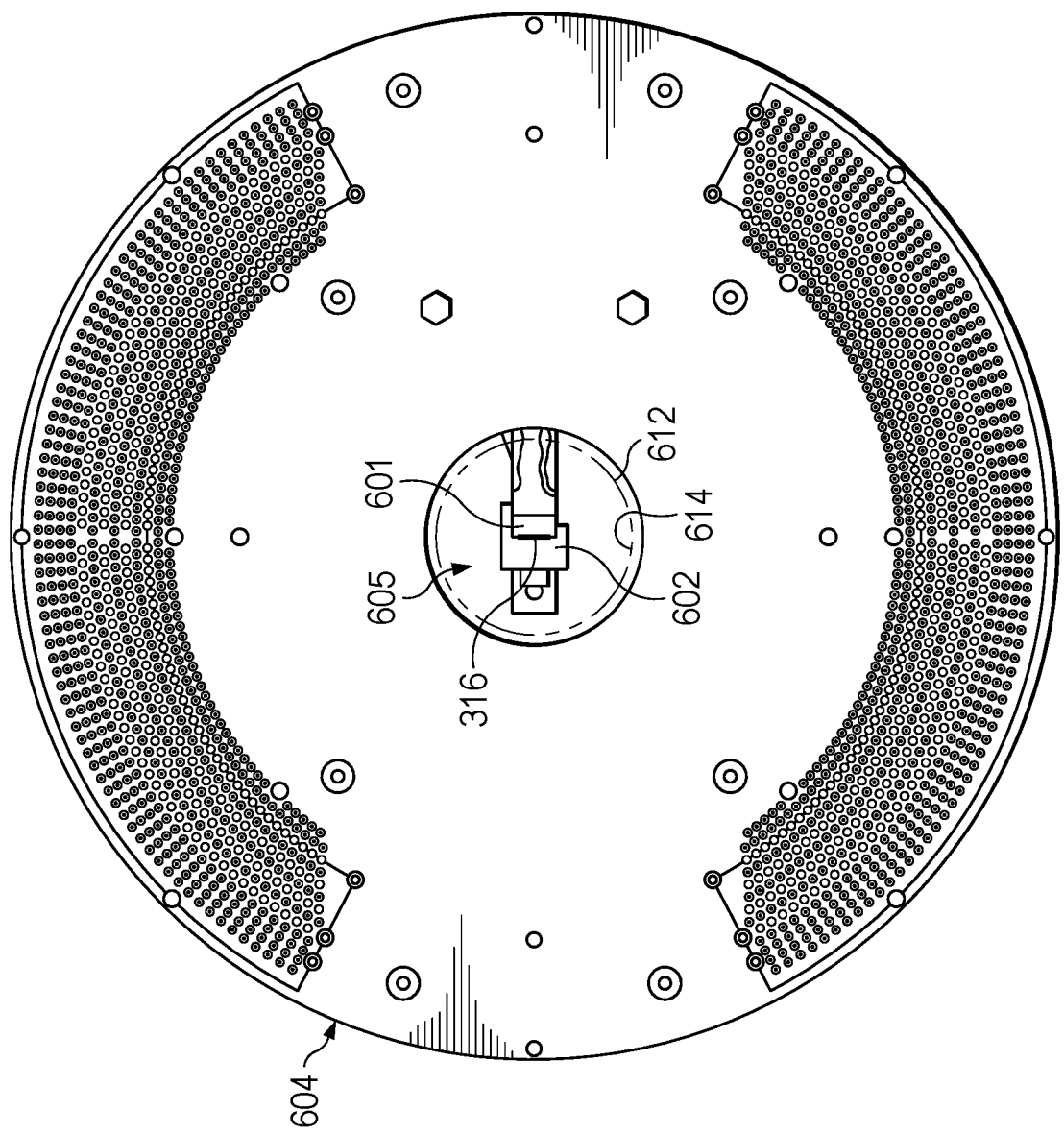
Figure 6E:
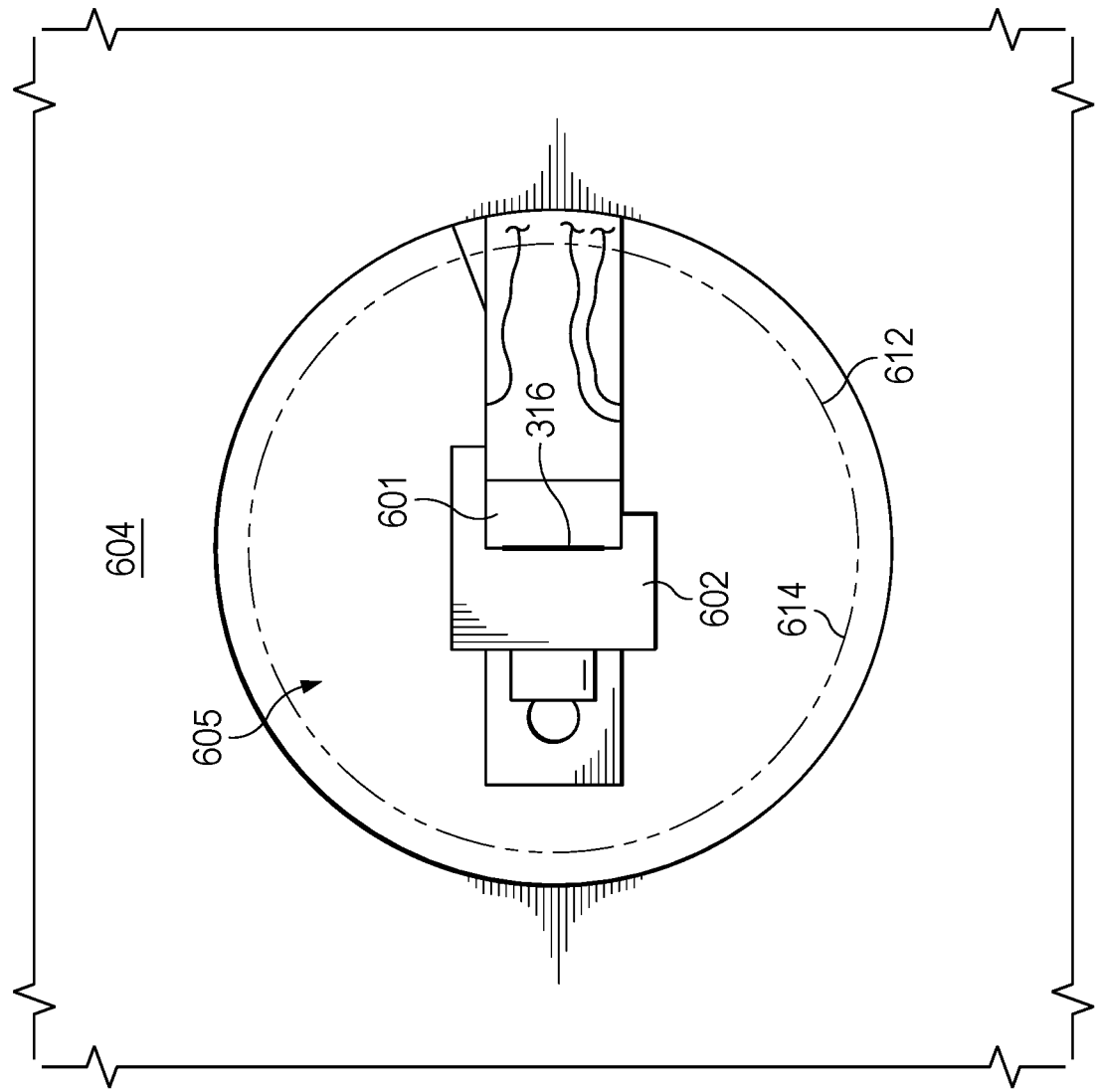

In at least some of the examples described above, the blade 316 is flanked on multiple sides by vacuum ports 302, 304. In other examples, however, the blade 316 may be positioned within a vacuum port. FIG. 6A is a perspective view of such an example. Specifically, FIG. 6A shows a probe card 604 having a vacuum port 605. A mechanical arm base 600 supports a mechanical arm 601 having a blade extension member 602 coupled to the mechanical arm 601. A vacuum hose 610 has a vacuum nozzle 612 that is mated to the vacuum port 605, and the vacuum nozzle 612 terminates at a vacuum orifice 614 (shown in FIG. 6C). The blade 316 is suspended in the vacuum orifice 614. A storage device 606 is coupled to a strain gauge 603, and the strain gauge 603 is coupled to the mechanical arm 601. FIG. 6B is a top-down view of the structure of FIG. 6A. FIG. 6C is a bottom-up view of the structure of FIG. 6A. FIG. 6C shows the blade 316 coupled to the distal end of the blade extension member 602. FIG. 6D is a profile view of the structure of FIG. 6A. FIG. 6E is a close-up view of the blade extension member 602 and the blade 316. In examples, the blade 316 of FIGS. 6A-6E has similar or identical characteristics as those described above for the blade 316 of FIGS. 3A-3H. FIGS. 6B-6E illustrate the mechanical arm base 600 suspending the blade 316 in and/or below the vacuum orifice 614. In some examples, the blade 316 is adequately large and positioned such that the blade 316 is suspended in the vacuum orifice 614, meaning that the vacuum orifice 614 lies in a horizontal plane that is coincident with at least part of the blade 316. In other examples, the blade 316 is of a size and/or is positioned such that the blade 316 is suspended below the vacuum orifice 614, meaning that the vacuum orifice 614 lies in a horizontal plane that is above the entirety of the blade 316.

Figure 7:
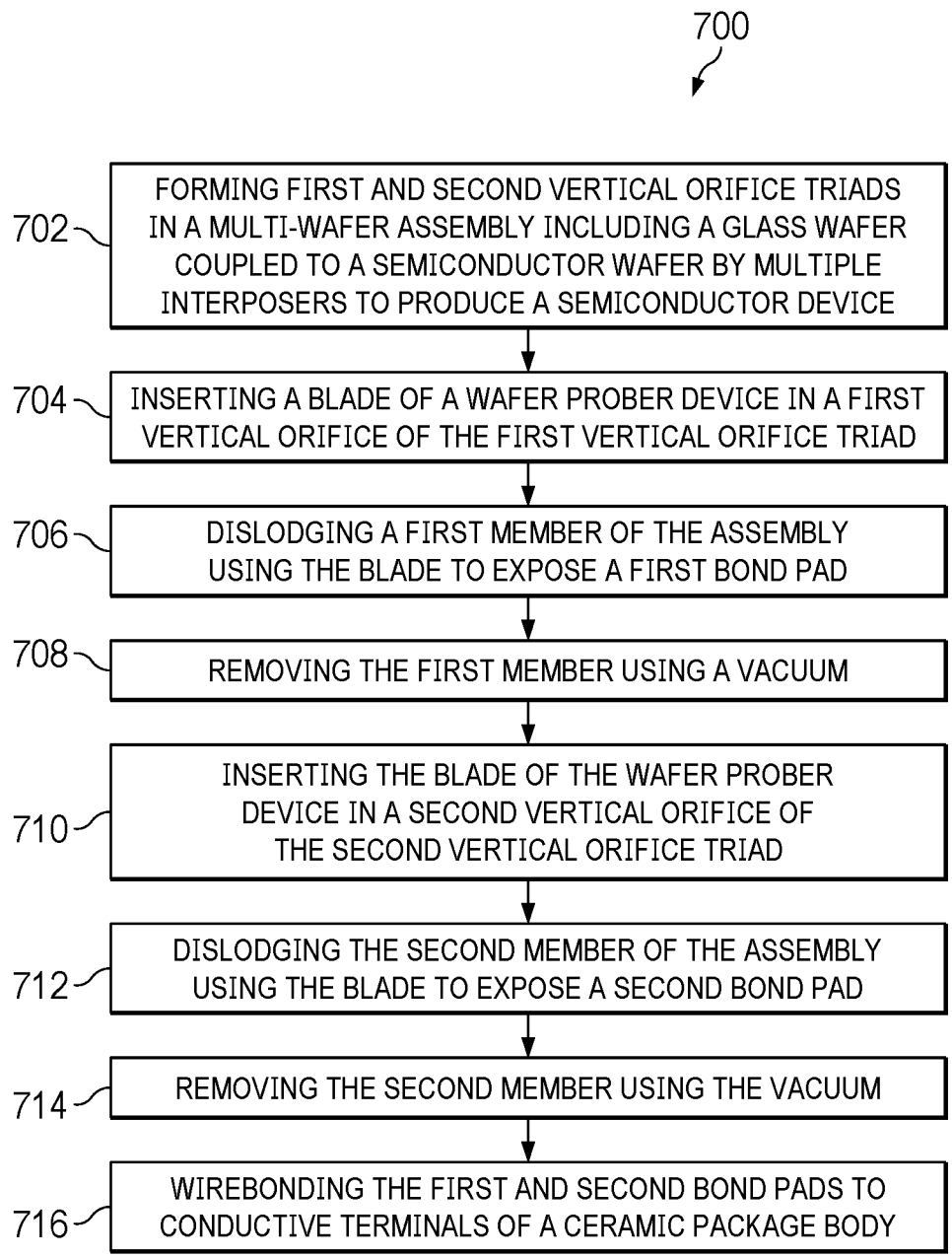
FIG. 7 is a flow diagram of a method for manufacturing a semiconductor package in accordance with various examples.

FIG. 7 is a flow diagram of a method 700 for manufacturing a semiconductor package in accordance with various examples, and specifically using the probe card 604. FIGS. 8A1-8G3 are a process flow for manufacturing a semiconductor package, in accordance with various examples. Accordingly, FIGS. 7 and 8A1-8G3 are now described in parallel. The method 700 begins with forming first and second vertical orifice triads in a multi-wafer assembly, which includes a glass wafer coupled to a semiconductor wafer by multiple interposers, to produce a semiconductor device (702). Step 702 may be performed by any suitable technique using any suitable apparatus. For example, step 702 may be performed using a laser or a saw. In examples, each triad of vertical orifices includes a middle vertical orifice that extends through the glass wafer, the interposers underlying the glass wafer, and the semiconductor wafer underlying the interposers. Further, each triad of vertical orifices includes left and right vertical orifices on either side of the middle vertical orifice, each of which extends through the glass wafer and into the interposers, but not through the interposers. The left and right vertical orifices in each triad of vertical orifices do not extend to the semiconductor wafer below the interposers. FIG. 8A1 depicts a profile cross-sectional view of the multi-wafer assembly 206, which includes a semiconductor (e.g., silicon) wafer 500, a glass wafer 504, and interposers 506 coupled therebetween. Mirrors 508 are coupled to the device side of the semiconductor wafer 500. Bond pads 510 are positioned on the device side of the semiconductor wafer 500. A first triad of vertical orifices 512, 514, 516 and a second triad of vertical orifices 513, 515, 517 are formed in the multi-wafer assembly 206. As described above and as shown, the middle vertical orifice 514 in the first triad of vertical orifices extends through the glass wafer 504, the interposers 506, and the semiconductor wafer 500. Similarly, the middle vertical orifice 515 in the second triad of vertical orifices extends through the glass wafer 504, the interposers 506, and the semiconductor wafer 500. In contrast, the vertical orifices 512 and 516 extend through the glass wafer 504 and through only part of the interposers 506, and similarly, the vertical orifices 513 and 517 extend through the glass wafer 504 and through only part of the interposers 506. The vertical orifices 512, 514, 516 produce wafer members 520, 522, and the vertical orifices 513, 515, 517 produce wafer members 519, 521. The wafer members 520, 522 obstruct access to the bond pads 510 that are positioned below the wafer members 520, 522. Similarly, the wafer members 519, 521 obstruct access to the bond pads 510 that are positioned below the wafer members 519, 521. As the vertical orifices 514, 515 extend through the semiconductor wafer 500, the multi-wafer assembly 206 has been singulated to produce a semiconductor device (e.g., a die).

The method 700 includes inserting a blade of a wafer prober device in a first vertical orifice of the first vertical orifice triad (704). The method 700 also includes dislodging a first member of the multi-wafer assembly using the blade to expose a first bond pad (706). As shown in the profile cross-sectional view of FIG. 8B1 and the top-down view of FIG. 8B2, the SWPD 100, and specifically the blade 316, is useful to dislodge the wafer members 520, 522 when the blade 316 is inserted in the vertical orifice 514 and translated back and forth along a single axis (e.g., horizontally, for example, toward and away from the vertical orifices 513, 515, 517). Consequently, the bond pads 510 underneath the wafer members 520, 522 are exposed and accessible for wirebonding.

One way the method 700 differs from the method 400 is the timing with which dislodged wafer members are removed by vacuum. Specifically, as FIG. 6A shows, the blade extension member 602 is positioned within the vacuum orifice 315, thereby enabling the vacuum orifice 315 to remove dislodged wafer members as the blade 316 dislodges the wafer members. This is in contrast to the vacuum orifices 315 of FIGS. 3A-3H, which are offset from (e.g., not co-located with) the blade 316, thereby removing dislodged wafer members after the blade 316 has been indexed to the next vertical orifice in the multi-wafer assembly. Accordingly, in method 700, and in contrast to the method 400, the wafer member dislodged in step 706 is removed by vacuum in step 708, where steps 706 and 708 are performed substantially simultaneously. FIGS. 8C1 and 8C2 depict the removal described in step 708. In steps 710, 712, and 714, and as depicted in FIGS. 8D1, 8D2, 8E1, and 8E2, the wafer member dislodging and vacuum removal steps are repeated for another wafer member. Thus, steps 706 and 712 are performed in a serial manner. The bond pads 510 that are exposed as a result of the method 700 (FIGS. 8F1 and 8F2) may then be wirebonded and covered by a semiconductor package, such as a ceramic package (716), as FIGS. 8G1, 8G2, and 8G3 depict.

The strain gauge 603 and storage device 606 provide and store measurements captured during performance of the method 700. Specifically, the strain gauge 603 may capture strain experienced by the mechanical arm 601 as the mechanical arm 601 dislodges wafer members, as described above. The results of the dislodging process, such as whether the dislodging occurred successfully, whether the blade 316 was damaged, whether the wafer members were damaged or removed incompletely, etc., may be observed by a machine or a human and recorded. The strain gauge 603 measurements stored in the storage device 606 may then be compared to the results of the dislodging process and the operation of the mechanical arm 601 may be modified appropriately to achieve consistently successful dislodging of wafer members.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means+/−10 percent of the stated value. Modifications are possible in the described examples, and other examples are possible within the scope of the claims.

What is claimed is:

1. A method for manufacturing a semiconductor package, the method comprising:
    forming a first triad of orifices in an assembly, the assembly comprising a first wafer and a second wafer, the first triad of orifices including a first orifice, a second orifice, and a third orifice, a first member between the first orifice and the second orifice and a second member between the first orifice and the third orifice;
    forming a second triad of orifices in the assembly to produce a die, the second triad of orifices including a fourth orifice, a fifth orifice, and a sixth orifice, a third member between the fourth orifice and the fifth orifice and a fourth member between the fourth orifice and the sixth orifice;
    inserting a blade of a wafer prober device in the first orifice;
    dislodging the first member and the second member using the blade to expose a first bond pad;
    inserting the blade in the fourth orifice;

dislodging the third member and the fourth member using the blade to expose a second bond pad;
removing the first member and the second member using a vacuum while dislodging the third member and the fourth member;
removing the third member and the fourth member using the vacuum; and
wirebonding the first and second bond pads to conductive terminals of a ceramic body of the semiconductor package.

2. The method of claim 1, wherein the dislodging the first member using the blade includes translating the blade in multiple directions along a single axis.

3. The method of claim 1, wherein the inserting of the blade in the first orifice is performed using a dial gauge.

4. The method of claim 1, wherein the first wafer is a semiconductor wafer and the second wafer is a glass wafer.

5. A method comprising:
forming a first triad of orifices in an assembly comprising a first wafer and a second wafer, the first triad of orifices including a first orifice, a second orifice, and a third orifice, a first member between the first orifice and the second orifice and a second member between the first orifice and the third orifice;
inserting a blade in the first orifice;
dislodging, with the blade, the first member and the second member;
removing the first member and the second member using a vacuum, to expose a bond pad;
forming a second triad of orifices in the assembly, the second triad of orifices including a fourth orifice, a fifth orifice, and a sixth orifice, a third member between the fourth orifice and the fifth orifice and a fourth member between the fourth orifice and the sixth orifice; and
removing the third member and the fourth member using the vacuum.

6. The method of claim 5, further comprising:
dislodging the third member and the fourth member;
wherein the removing of the first member and the second member using the vacuum is performed while dislodging the third member and the fourth member.

7. The method of claim 5, wherein the removing of the first member and the second member using the vacuum is performed while dislodging the first member and the second member.

8. The method of claim 5, wherein the first wafer is a semiconductor wafer and the second wafer is a glass wafer.

9. The method of claim 8, wherein the assembly further comprises an interposer between the semiconductor wafer and the glass wafer.

10. The method of claim 9, wherein the first orifice extends through the glass wafer, the interposer, and the semiconductor wafer, the second orifice extends through the glass wafer and a portion of the interposer, and the third orifice extends through the glass wafer and a portion of the interposer.

11. The method of claim 8, wherein the semiconductor wafer includes a microelectromechanical systems (MEMS) device.

12. The method of claim 11, wherein the MEMS device comprises mirrors.

13. The method of claim 5, wherein the first wafer is coupled to a tape and the bond pad is a first bond pad, the method further comprising:
inserting a blade in the fourth orifice; and
dislodging the third member and the fourth member;
wherein the removing of the third member and the fourth member using the vacuum exposes a second bond pad.

14. The method of claim 13, further comprising:
picking the die from the tape and placing the die in a ceramic package;
wirebonding the first bond pad to first conductive terminals on the ceramic package; and
wirebonding the second bond pad to second conductive terminals on the ceramic package.

15. A method comprising:
obtaining an assembly comprising a semiconductor wafer and a glass wafer, the semiconductor wafer having a microelectromechanical systems (MEMS) device;
forming a triad of orifices in an assembly, the triad of orifices including a first orifice, a second orifice, and a third orifice, a first member between the first orifice and the second orifice and a second member between the first orifice and the third orifice;
forming a second triad of orifices in the assembly, the second triad of orifices including a fourth orifice, a fifth orifice, and a sixth orifice, a third member between the fourth orifice and the fifth orifice and a fourth member between the fourth orifice and the sixth orifice;
inserting a blade in the first orifice;
dislodging, with the blade, the first member and the second member;
inserting the blade in the fourth orifice;
dislodging the third member and the fourth member;
removing the first member and the second member using a vacuum to expose a bond pad;
removing the third member and the fourth member using the vacuum; and
wirebonding the bond pad to a conductive terminal of a ceramic package.

16. The method of claim 15, wherein:
the removing of the first member and the second member using the vacuum is performed while dislodging the third member and the fourth member.

17. The method of claim 15, wherein the removing of the first member and the second member using the vacuum is performed while dislodging the first member and the second member.

18. The method of claim 15, wherein the assembly further comprises an interposer between the semiconductor wafer and the glass wafer, the first orifice extends through the glass wafer, the interposer, and the semiconductor wafer, the second orifice extends through the glass wafer and a portion of the interposer, and the third orifice extends through the glass wafer and a portion of the interposer.

19. The method of claim 15, wherein the semiconductor wafer is coupled to a tape and the bond pad is a first bond pad, wherein:
the removing of the third member and the fourth member using the vacuum exposes a second bond pad.

20. The method of claim 19, further comprising:
picking the die from the tape and placing the die in a ceramic package; and
wirebonding the second bond pad to second conductive terminals on the ceramic package.

* * * * *